United States Patent
Takano et al.

(10) Patent No.: US 6,696,155 B1
(45) Date of Patent: *Feb. 24, 2004

(54) PREPREG FOR PRINTED WIRING BOARDS, RESIN VARNISH, RESIN COMPOSITION AND LAMINATE FOR PRINTED WIRING BOARDS PRODUCED BY USING THESE SUBSTANCES

(75) Inventors: Nozomu Takano, Yuki (JP); Shigeo Sase, Shimodate (JP); Tomio Fukuda, Shimodate (JP); Michitoshi Arata, Shimodate (JP)

(73) Assignee: Hitachi Chemical Company, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/981,570

(22) PCT Filed: Jun. 20, 1996

(86) PCT No.: PCT/JP96/01708

§ 371 (c)(1), (2), (4) Date: Dec. 23, 1997

(87) PCT Pub. No.: WO97/01595

PCT Pub. Date: Jan. 16, 1997

(30) Foreign Application Priority Data

Jun. 27, 1995 (JP) .............................. 7-160674
Oct. 3, 1995 (JP) .............................. 7-255871
Oct. 3, 1995 (JP) .............................. 7-255872
Oct. 3, 1995 (JP) .............................. 7-255873

(51) Int. Cl.$^7$ .............................. B32B 9/00; C08K 9/06; C08K 5/24

(52) U.S. Cl. .............................. 428/391; 428/405; 428/447; 523/212; 523/216; 524/261; 524/264; 524/265; 427/372.2; 427/212; 427/215

(58) Field of Search .............................. 428/447, 405; 524/538, 540, 261, 265, 266; 523/400, 443, 212, 213, 216; 525/431, 420, 440, 476; 427/96, 393.5, 212, 215, 372.2

(56) References Cited

U.S. PATENT DOCUMENTS

| | | | | |
|---|---|---|---|---|
| 3,825,618 A | * | 7/1974 | Pepe .............................. | 260/827 |
| 4,652,618 A | * | 3/1987 | Sumida et al. .............................. | 525/478 |
| 4,694,040 A | * | 9/1987 | Hashimoto et al. .............................. | 524/765 |

(List continued on next page.)

FOREIGN PATENT DOCUMENTS

| | | |
|---|---|---|
| JP | 1-141925 | 6/1989 |
| JP | 2-88448 | 3/1990 |
| JP | 5-283826 | 10/1993 |

OTHER PUBLICATIONS

Patent Abstracts of Japan, No. 01204953 (17–08–89).
"Toray Silicone", No. Z003 (Aug. 1983).

*Primary Examiner*—Paul Thibodeau
*Assistant Examiner*—Kevin R Kruer
(74) *Attorney, Agent, or Firm*—Antonelli, Terry, Stout & Kraus, LLP

(57) ABSTRACT

Printed wiring boards improved in the drilling processability and insulation properties are produced either by treating the surfaces of base materials or inorganic fillers with silicone oligomers having specified structures, particularly, a three-dimensionally crosslinked silicone oligomer, or by using resin varnish prepared by compounding such a silicone oligomer with a resin varnish for impregnation of the base materials, or by dipping the inorganic fillers in a solution of such a silicone oligomer for surface treatment and then directly compounding resin materials with the solution.

59 Claims, 2 Drawing Sheets

U.S. PATENT DOCUMENTS

| | | | | |
|---|---|---|---|---|
| 4,778,860 A | * | 10/1988 | Morita et al. | 525/431 |
| 5,002,637 A | * | 3/1991 | Toyoshima et al. | 162/137 |
| 5,173,359 A | | 12/1992 | Toyoshima et al. | 428/229 |
| 5,182,173 A | * | 1/1993 | Swei | 428/391 |
| 5,856,016 A | * | 1/1999 | Takahashi et al. | 428/428 |
| 5,939,472 A | * | 8/1999 | Ito et al. | 523/433 |
| 5,967,906 A | * | 10/1999 | Horiuchi et al. | 473/365 |
| RE36,396 E | * | 11/1999 | Arthur et al. | 428/331 |
| 6,017,389 A | * | 1/2000 | Schmidt et al. | 106/287.1 |
| 6,107,418 A | * | 8/2000 | Mueller | 525/477 |

\* cited by examiner

PREPREG FOR PRINTED WIRING BOARDS, RESIN VARNISH, RESIN COMPOSITION AND LAMINATE FOR PRINTED WIRING BOARDS PRODUCED BY USING THESE SUBSTANCES

The present application is the U.S. national stage under 35 U.S.C. 371 of the International Application No. PCT/JP96/01708, filed Jun. 20, 1996, claiming priority of Japanese Patent Applications 07-160674, filed Jun. 27, 1995; 07-255871, filed Oct. 3, 1995; 07-255872, filed Oct. 3, 1995; and 07-255873 filed Oct. 3, 1995.

TECHNICAL FIELD

The present invention relates to the production of prepregs and resin varnishes useful for the production of printed wiring boards including multilayer printed wiring boards. The present invention also relates to resin compositions useful for the production of printed wiring boards. The present invention further relates to laminates for printed wiring boards which are produced by using the prepregs or the resin varnishes.

BACKGROUND ART

As electronic instruments have been miniaturized and improved in performance, the mounting density of laminates for printed wiring boards has been increased by making the laminates thinner and more multilayered and by reducing the diameter and hole pitch of through holes. Thus the requirements of laminates for heat resistance, drilling processability and insulation properties are becoming more strict.

Laminates are generally produced by impregnating a base material with a resin varnish and drying to form a prepreg, and superposing a desired number of sheets of the prepreg on each other with a metal foil superposed on one or both sides, and heating and pressing with a parallel heat machine. Multilayer printed wiring boards are generally produced by superposing prepregs on each side of an inner printed wiring board produced by circuit-patterning a double-sided metal-clad laminate, and then superposing metal foil on the prepregs, and then bonding the superposed composite with heat and pressure between a parallel heat machine.

To improve the heat resistance and insulation properties, the improvements in the properties of the cured resins in the laminates have widely been tried, for example, by increasing the Tg (glass transition temperature) of the resins. Such improvements in resin properties, however, became insufficient to satisfy the required properties.

In parallel with the improvements in the resin properties, a long-standing investigation has been made to increase the base material/resin interfacial adhesion. Interface control is a very important technique since the degree of interfacial adhesion directly influences the resistance against heat and moisture, drilling processability, insulation properties and electrolytic corrosion resistance of laminates.

Another means is the addition of inorganic fillers. Inorganic fillers are used not only as extenders but also for improving dimensional stability and resistance against moisture and heat, and selective use of specific fillers has recently been investigated to attain excellent properties, such as high dielectric constant, efficient radiation and high strength. However, fillers added to resin varnishes precipitate slowly and should be dispersed again by stirring or the like at the time of coating. When the precipitation is considerable, the precipitated fillers cohere on the bottom of containers, and become difficult to disperse by stirring alone. During the production of prepregs, fillers also precipitate in apparatuses where varnishes stay, for example, in varnish tanks and impregnating tanks, and gradually adhere to rolls, etc. This deteriorates the appearance of prepregs considerably. In laminates, the inhomogeneously dispersed fillers decrease the interfacial adhesion between base materials and resins or between the fillers and resins, thereby deteriorating the drilling processability and insulation properties.

A general method of improving the base material/resin interfacial adhesion is the pretreatment of base materials, such as glass woven fabric, with surface treating agents, such as coupling agents. Prepregs are produced by impregnating a surface-treated base material with a resin varnish and then drying to semi-cure the resin. During the drying step, the reaction of the surface treating agent on the surface of the base material with the resin proceeds to some degree, and further proceeds during the following heating step for forming laminates or multilayer printed wiring boards, to increase the adhesion between the base material and the resin. A known method of further increasing the adhesion is to improve the reactivity of surface treating agents with resins by varying the number and kinds of the organic functional groups on the conventional surface treating agents, such as silane coupling agents (Japanese Patent Application Unexamined Publication No. 63-230729 and Japanese Patent Application Examined Publication No. 62-40368). The improved reactivity with resins, however, merely gives a rigid and thin layer on the interfaces, and cannot decrease the residual stress set up on the interfaces and cannot improve the adhesion remarkably.

Another method of improvements, including a reduction of the residual stress on interfaces, is the use of surface treating agents together with long chain polysiloxanes which reduce such stress (Japanese Patent Application Unexamined Publication Nos. 3-62845 and 3-287869). The method, however, is far from effective in increasing the interfacial adhesion since the reactivity of surface treating agents with long chain polysiloxanes is very poor under usual treating conditions, long chain polysiloxane have no alkoxyl groups reactive to base materials, and the hydrophobic groups, such as methyl groups, on long chain polysiloxanes disturb the impregnation of base materials with the long chain polysiloxanes.

It has also been tried to improve the dispersibility of fillers by using fillers treated with surface treating agents, such as coupling agents. However, commercially available surface-treated fillers are expensive, and the kinds thereof are too little to select a proper filler for each of various resin blends. For further improvements in functions, the amount of fillers blended in resins is now increasing. As the amount of fillers increases, the above-described precipitation and adhesion to rolls become more considerable, requiring further improvements in dispersibility and thixotropy. The conventional treatments with coupling agents cannot satisfy such requirements.

In addition, the treatments of fillers with surface treating agents are generally performed by dipping or spraying using diluted solutions of the surface treating agents, followed by drying with heat. The drying step raises two problems, namely, the formation of physically adsorbed layer of oligomerized coupling agents on the filler surfaces, and the cohesion of fillers, which necessitates grinding at the time of blending with resin varnishes. Such grinding roughens the surface treating agent layers on fillers. The physically adsorbed layers and the uneven layers of surface treating agents decrease the interfacial adhesion in laminates.

It is also proposed in Japanese Patent Application Unexamined Publication No. 61-272243 to add coupling agents directly into resin varnishes under preparation. The layers formed from commercial coupling agents are also too rigid and thin to improve the interfacial adhesion between base material/resin. On the other hand, this method somewhat prevents the cohesion of fillers because of the high viscosity of the resin varnishes containing resins. From the viewpoint of the filler/resin interfacial adhesion, the coupling agents cannot align selectively and uniformly on the filler surfaces, and cannot bond the fillers and resins sufficiently.

FIG. 1 shows a schematic view illustrating an ideal state of the surfaces of base materials or fillers which are treated with conventional silane-coupling agents. Chemically adsorbed silicone chains 2 (silicone chains adsorbed via chemical bonding with base materials or fillers) form a layer of a certain thickness on the surface of a base material or inorganic filler 1, and improve the adhesion to a resin layer 4. The layer of chemically adsorbed silicone chains 2 bears physically adsorbed silicone chains 3 (silicone chains having no chemical bonds with the base material or filler) thereon. However, it is commonly recognized that the state as shown in FIG. 2 is the actual state made by industrial surface treatments of base materials or fillers, which are performed in a short time. That is, even the chemically adsorbed silicone chains 2 do not cover the surface of the base material or filler 1 uniformly, and there are many physically adsorbed silicone chains 3, which are easily eluted into the resin layer 4. Such a defective chemically adsorbed layer cannot fully exhibit its bonding function. The physically adsorbed layer may inhomogenize and weaken the resin which is cured near the interface, and may rather decrease the adhesion.

In Japanese Patent Application Unexamined Publication No. 1-204953 is proposed to solve such problems by treating inorganic fillers with a linear polysiloxane which has both trialkoxyl groups reactive to inorganic fillers and organic functional groups reactive to resins. As shown in FIG. 3, chemically adsorbed linearly long polysiloxane chains 6 tend to lie on the filler surface due to the alignment of hydrophobic groups, such as methyl groups, and hardly penetrate into the resin layer 4. Also such long chains bond to the inorganic filler surface at several sites per molecule and tend to form a rigid layer. Even if penetrated into the resin, the siloxane chains are surrounded by the resin, and the decrease in the interfacial stress does not correspond to the chain length. Further, the physically adsorbed long polysiloxane chains 7 easily form large cyclic chains 5, which tend to deteriorate the properties of cured resins.

DISCLOSURE OF INVENTION

The object of the present invention is to solve the above-described problems in the prior arts by providing novel means for improving the interfacial adhesion between base materials or inorganic fillers with resins, thereby enabling the production of laminates and multilayer printed wiring boards which are excellent in drilling processability and insulation properties.

The inventors found that the above-described problems can be solved by using, as surface treating agents for base materials and inorganic fillers, a silicone oligomer having functional groups reactive to the hydroxyl groups which are present structurally or by moisture absorption on the surfaces of base materials and fillers, or by using novel method for producing resin varnishes containing inorganic fillers treated with such a silicone oligomer, and have consequently completed the present invention.

That is, the present invention provides a method of producing a prepreg for printed wiring boards, comprising treating a base material with a silicone oligomer having at least one functional end group reactive to a hydroxyl group, impregnating the treated base material with a resin varnish, and drying the impregnated base material.

The present invention also provides a laminate for printed wiring boards (hereinafter, it may be called "laminate (a)"), which is produced by superposing two or more sheets of the above-described prepreg, with a metal foil superposed on one or both sides of the superposed sheets of the prepreg, to form a superposed composite, and then bonding the superposed composite with heat and pressure.

The present invention further provides a method of producing a resin varnish for printed wiring boards comprising dipping an inorganic filler in a treating liquid for surface treatment, and then compounding a resin material directly with the treating liquid containing the treated inorganic filler, wherein the treating liquid comprises a silicone oligomer dissolved in a solvent, and the silicone oligomer contains at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, has a polymerization degree of 2 to 70, and has at least one functional end group reactive to a hydroxyl group.

The present invention also provides a laminate for printed wiring boards (hereinafter, it may be called "laminate (b)"), which is produced by impregnating a base material with the resin varnish produced by the above described method, drying the impregnated base material to form a prepreg, superposing two or more sheets of the prepreg, with a metal foil superposed on one or both sides of the superposed sheets of the prepreg, to form a superposed composite, and then bonding the superposed composite with heat and pressure.

The present invention further provides a resin composition for printed wiring boards (hereinafter, it may be called "resin composition for printed wiring boards (A)" or "resin composition (A)") comprising a resin material and a silicone oligomer which contains at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, has a polymerization degree of 2 to 70, and has at least one functional end group reactive to a hydroxyl group.

The present invention also provides a laminate for printed wiring boards (hereinafter, it may be called "laminate (c)"), which is produced by impregnating a base material with the resin composition (A), drying the impregnated base material to form a prepreg, superposing two or more sheets of the prepreg, with a metal foil superposed on one or both sides of the superposed sheets of the prepreg, to form a superposed composite, and then bonding the superposed composite with heat and pressure.

The present invention further provides a resin composition for printed wiring boards (hereinafter, it may be called "resin composition for printed wiring boards (B)" or "resin composition (B)") comprising a resin material and an inorganic filler treated with a silicone oligomer which contains at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, has a polymerization degree of 2 to 70, and has at least one functional end group reactive to a hydroxyl group.

The present invention also provides a laminate for printed wiring boards (hereinafter, it may be called "laminate (d)"), which is produced by impregnating a base material with the resin composition (B), drying the impregnated base material to form a prepreg, superposing two or more sheets of the prepreg, with a metal foil superposed on one or both sides of the superposed sheets of the prepreg, to form a superposed composite, and then bonding the superposed composite with heat and pressure.

BEST MODE FOR CARRYING OUT THE INVENTION

Figure 1:
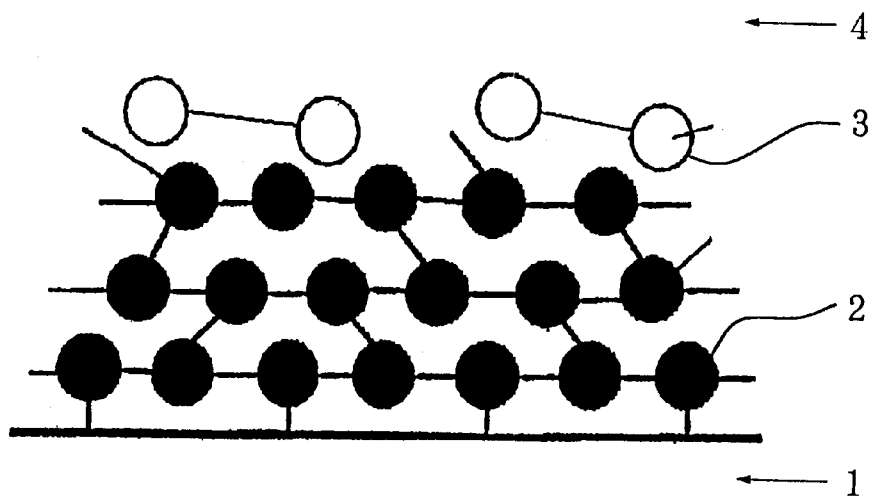
FIGS. 1 to 4 are schematic views illustrating the states of the interfaces between resins and base materials or inorganic fillers treated with surface treating agents.
Figure 2:
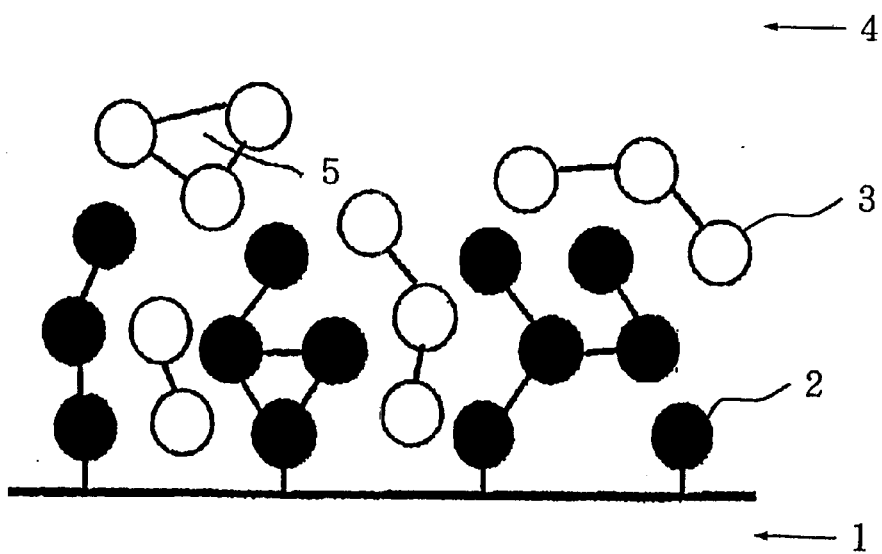
Figure 3:
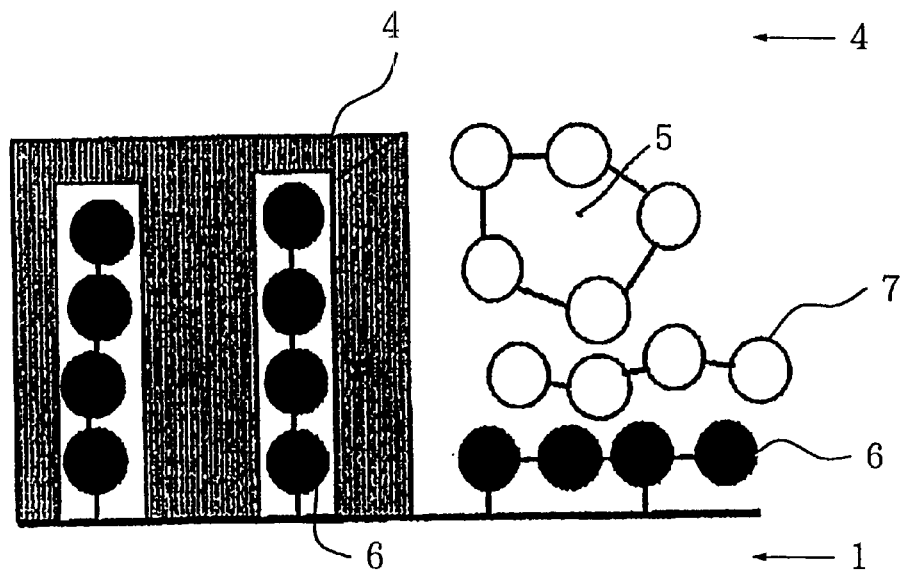

Method of Producing Prepregs for Printed Wiring Boards

In the method of producing prepregs for printed wiring boards according to the present invention, first a base material is treated with a silicone oligomer having at least one functional end group reactive to a hydroxyl group.

Base materials which may be used in the present invention may be those commonly used for the production of metal-clad laminates or multilayer printed wiring boards, and are generally fiber base materials, including woven fabrics and non-woven fabrics. Non-limiting examples of the fiber base materials are inorganic fibers, such as glass fiber, alumina fiber, asbestos fiber, boron fiber, silica alumina glass fiber, silica glass fiber, tyranno fiber, silicon carbide fiber, silicon nitride fiber, zirconia fiber and carbon fiber, organic fibers, such as aramid fiber, polyetheretherketone fiber, polyetherimide fiber, polyethersulfone fiber and cellulose fiber, and mixed fibers thereof, and the particularly preferred example is a woven fabric of glass fibers.

The surface state of the base materials to be treated with the silicone oligomers is not limited, and may have been pretreated with conventional surface treating agents, such as silane coupling agents. It is generally preferable to use base materials which have not been treated with other conventional surface treating agents and have on their surfaces hydroxyl groups which react with the silicone oligomer.

The silicone oligomers which may be used in the present invention are not limited in molecular weight and structure so far as they have at least one functional end group reactive to the hydroxyl groups on base materials. Preferred examples of the functional end groups reactive to the hydroxyl groups on the surfaces of base materials are alkoxyl groups of one or two carbon atoms or silanol group.

Preferred silicone oligomers contain at least one kind of siloxane units selected from the group consisting of difunctional siloxane units ($R_2SiO_{2/2}$, wherein R is an organic group, for example, an alkyl group of one or two carbon atoms, namely methyl or ethyl, an aryl group of 6 to 12 carbon atoms, such as phenyl, and vinyl, and the R groups in the silicone oligomer may be identical with or different from one another), trifunctional siloxane units ($RSiO_{3/2}$) and tetrafunctional siloxane units ($SiO_{4/2}$), have a polymerization degree of 2 to 70 (conversion from weight average molecular weight determined by GPC). Silicone oligomers of polymerization degrees of higher than 70 may cause uneven treatment to decrease heat resistance.

The difunctional, trifunctional and tetrafunctional siloxane units represented, respectively, by $R_2SiO_{2/2}$, $RSiO_{3/2}$ and $SiO_{4/2}$ have the following structures:

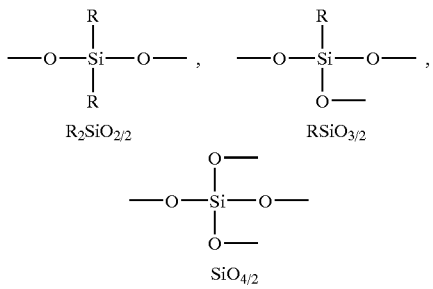

Preferred silicone oligomers are three-dimensionally crosslinked oligomers, which comprise at least one kind of siloxane units selected from difunctional siloxane units, trifunctional siloxane units and tetrafunctional siloxane units and contain at least one kind of siloxane units selected from trifunctional siloxane units and tetrafunctional siloxane units. That is, the preferred silicone oligomers comprise only trifunctional siloxane units, or only tetrafunctional siloxane units, or difunctional siloxane units and trifunctional siloxane units, or difunctional siloxane units and tetrafunctional siloxane units, or trifunctional siloxane units and tetrafunctional siloxane units, or difunctional siloxane units, trifunctional siloxane units and tetrafunctional siloxane units. Further, tetrafunctional siloxane units are preferably 15 mol % or more, more preferably 20 to 60 mol %, based on total siloxane units. To coat the surfaces of base materials with a highly three-dimensionally crosslinked layer, it is preferable to use silicone oligomers containing trifunctional siloxane units and/or tetrafunctional siloxane units preferably and having a polymerization degree of 6 to 70, more preferably 10 to 50. Such silicone oligomers are synthesized, for example, by polycondensing one or more kinds of chloro or alkoxysilanes corresponding to the desired siloxane units, in the presence of water and acid catalysts. The polycondensation is carried out to such a degree that the resulting silicone oligomers are not gelified before surface treatment, by varying or controlling the reaction temperature, the reaction time, the compositions of the oligomers, and the kind and amount of the catalysts. Suitable catalysts are, for example, acetic acid, hydrochloric acid, maleic acid and phosphoric acid.

Although the method of treating base materials, including the composition of the treating liquid containing the silicone oligomers and the treating conditions, is not particularly limited, the adhesion amount of the silicone oligomers on base materials is preferably 0.01 to 5% by weight, more preferably 0.05 to 2.00% by weight. Herein, the adhesion amount of surface treating agents means the percentage of the weight of the surface treating agents adhering to base materials or inorganic fillers, based on the weight of the base materials or inorganic fillers. An adhesion amount of less than 0.01% by weight may be ineffective in improving interfacial adhesion, and an adhesion amount of more than 5% by weight may deteriorate heat resistance.

The treating liquid used for treating base materials may contain, in addition to the silicone oligomers, solvents and additives including coupling agents, such as silane coupling agents and titanate coupling agents. Examples of the silane coupling agents which may be used include epoxysilane coupling agents, such as γ-glycidoxypropyltrimethoxysilane, aminosilane coupling agents, such as N-β-(N- vinylbenzylaminoethyl)-γ-aminopropyl-trimethoxysilane.hydrochloride, cationic silane coupling agents, vinylsilane coupling agents, acrylsilane coupling agents, mercaptosilane coupling agents, and mixtures thereof. An example of the titanate coupling agents is isopropyltris (dioctylpyrophosphate) titanate. The adhesion amounts of these coupling agents are not particularly limited. The surface-treatment of base materials with silane coupling agents or titanate coupling agents may also be carried out before or after the treatment with the silicone oligomers. In such cases, the adhesion amount of coupling agents is preferably 5% by weight or less, more preferably 0.01 to 5% by weight. To stabilize these components, the treating liquid may contain acids, such as acetic acid, phosphoric acid, maleic acid, hydrochloric acid and sulfuric acid. The amount of the acids is not particularly limited, and is generally such that the treating liquid is adjusted to a Ph of 3 to 6.

Although the method of treating base materials, including the composition of the treating liquid containing the silicone oligomers and the treating conditions, is not particularly limited, it is desirable to dip base materials in a treating liquid containing silicone oligomers dissolved in solvents, followed by drying at 50 to 200° C., preferably 80 to 150° C., for 5 to 60 minutes, preferably 10 to 30 minutes. In cases where solvents are used, the amount of the solvents are not particularly limited, but are desirably such that the concentration of the solids, such as silicone oligomers, is 0.01 to 50% by weight, preferably 0.05 to 10% by weight. The solvents are not particularly limited, and preferred examples include water, alcohols, such as methanol and ethanol, and ketones, such as methyl ethyl ketone and methyl isobutyl ketone.

The base materials treated with the silicone oligomer are then impregnated with resin varnishes and dried, to give prepregs.

Resin varnishes generally contain resins, or resins and curing agents therefor, as essential components. Resin varnishes, according to demands, may further contain, for example, solvents, cure accelerators for accelerating the reactions of the resins and the curing agents, and inorganic fillers.

Resins which may be used in the present invention for the production of prepregs are not particularly limited, and some examples include epoxy resin, polyimide resin, triazine resin, phenolic resin, melamine resin and modified resins therefrom. These resins preferably have a weight average molecular weight of 200 to 100,000, more preferably 200 to 10,000. Preferred epoxy resins have an epoxy equivalent weight of 100 to 5,000, more preferably 150 to 600. These resins may be used individually or as a mixture of two or more.

Curing agents may be selected from various known ones, and when epoxy resins are used as resins, for example, dicyandiamide, diaminodiphenylmethane, diaminodiphenylsulfone, phthalic anhydride, pyromellitic anhydride, and polyfunctional phenols, such as phenol novolac and cresol novolac, are suitable. Cure accelerators are not particularly limited and are, for example, imidazole compounds, organic phosphorus compounds, tertiary amines and quaternary ammonium salts, and these may be used individually or as a mixture of two or more.

The amounts of the curing agents and cure accelerators depend on the kinds and combinations of the resins and curing agents, or the like. The amount of curing agents is generally 0.1 to 200 parts by weight, preferably 3.0 to 100 parts by weight, per 100 parts by weight of the resins, and the amount of cure accelerators is generally 0.01 to 10.0 parts by weight, preferably 0.1 to 5.0 parts by weight, per 100 parts by weight of the resins.

Solvents which may be used are not limited, and some examples include alcohols, such as methanol and ethanol, ethers, such as ethylene glycol monomethyl ether, ketones, such as acetone, methyl ethyl ketone and methyl isobutyl ketone, amides, such as N,N-dimethylformamide, aromatic hydrocarbons, such as toluene and xylene, esters, such as ethyl acetate, and nitrites. These may be used individually or as a solvent mixture of two or more.

Inorganic fillers which may be used are not limited, and some examples include calcium carbonate, alumina, titanium oxide, mica, aluminum carbonate, aluminum hydroxide, magnesium silicate, aluminum silicate, clay, such as calcined clay, talc, silica, glass short fiber and various whiskers, such as aluminum borate whisker and silicon carbide whisker. These may be used individually or as a mixture of two or more. The amount of inorganic fillers is not limited, and is desirable 1.0 to 500 parts by weight, preferably 10 to 100 parts by weight, per 100 parts by weight of the resins. The inorganic fillers are not particularly limited in shape and particle size, and the particle size is desirably 0.01 to 50 $\mu$m, preferably 0.1 to 15.0 $\mu$m.

The surface-treated base materials are impregnated with a resin varnish which is a blend of the above-described components, by dipping, coating, spraying or the like, and then dried to give prepregs for printed wiring boards. Although the drying temperature and time depend on the composition of the resin varnish, the drying step is generally performed at a temperature of 80 to 200° C., preferably 100 to 180° C., which is not lower than the temperature at which the solvents, if any, can evaporate, for 3 to 30 minutes, preferably 5 to 15 minutes.

According to the present invention, prepregs are produced by using base materials which have been previously treated with a silicone oligomer having at least one functional end group reactive to the hydroxyl group present on the surfaces of base materials. In laminates or multilayer printed wiring boards produced by using the prepregs, the silicone oligomer works as a cushion between the base materials and cured resins, while the conventional coupling agents including silane coupling agents form a rigid and thin layer. Thus the silicone oligomer layer relieves the contortion on the interface between the base materials and the cured resins, to allow the resins to exhibit their excellent adhering properties.

Laminates (a) for Printed Wiring Boards

The laminate (a) of the present invention is useful for the production of printed wiring boards and is produced by superposing two or more sheets of a prepreg produced as above, with a metal foil superposed on one or both sides of the superposed sheets of the prepreg, to form a superposed composite, and then bonding the superposed composite with heat and pressure.

By heating and pressing the superposed prepreg, with metal foil superposed on one side, a single-sided metal-clad laminate is produced. By heating and pressing the superposed prepreg, with metal foil superposed on both sides, a double-sided metal-clad laminate is produced. The metal foil may be selected without limitation from those commonly used for the production of printed wiring boards, and copper foil is generally suitable. In general, the bonding is suitably performed by heating at a temperature of 150 to 200° C. for 30 to 150 minutes with pressing at 1 to 10 MPa.

Figure 4:
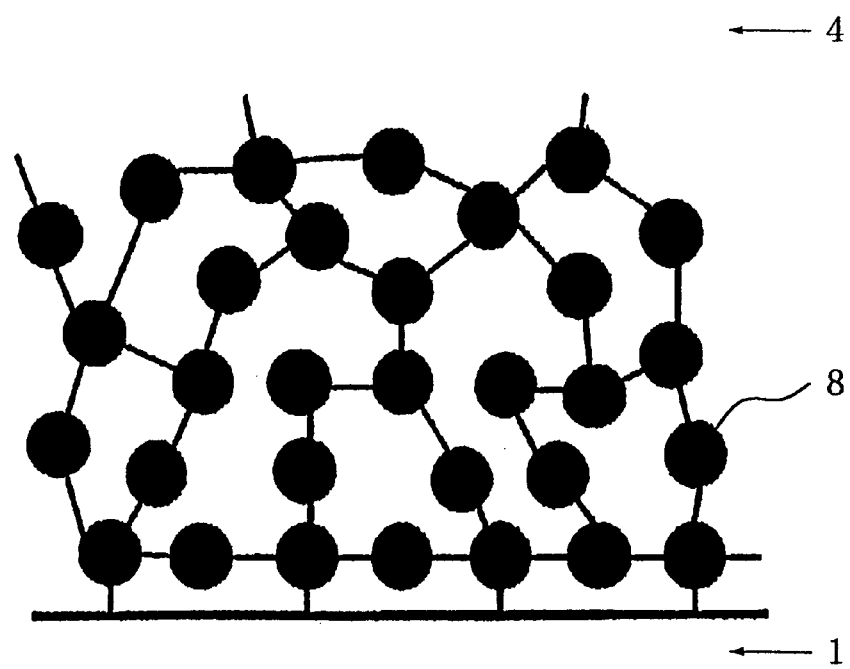

FIG. 4 is a schematic view illustrating the state of the interface between a base material 1 and a resin layer 4 in a laminate which is produced by using a prepreg produced by the method of the present invention, particularly a prepreg produced by using a three-dimensionally crosslinked silicone oligomer containing trifunctional siloxane units and/or tetrafunctional siloxane units. The three-dimensionally crosslinked silicone oligomer 8 is chemically adsorbed uniformly on the surface of the base material 1 to coat the base material surface completely, and cushions the distortion on the interface between the base material and the resin layer, to allow the resin to exhibit its excellent adhering function.

Method of Producing Resin Varnishes for Printed Wiring Boards

In the method of producing resin varnishes for printed wiring board according to the present invention, after an inorganic filler is dipped for surface treatment in a treating liquid which comprises a solution of a silicone oligomer containing at least one kind of siloxane units selected from trifunctional siloxane units ($Rsio_{3/2}$) and tetrafunctional siloxane units ($SiO_{4/2}$), wherein each R is an organic group and the organic groups R in the silicone oligomer are identical with or different from one another, having a polymerization degree of 2 to 70, and having at least one functional end group reactive to a hydroxyl group, a resin material is directly compounded with the treating liquid containing the treated inorganic filler.

Generally, the silicone oligomers which may be used in this method are three-dimensionally crosslinked silicone oligomers. For example, preferred silicone oligomers comprise only trifunctional siloxane units, or only tetrafunctional siloxane units, or difunctional siloxane units and trifunctional siloxane units, or difunctional siloxane units and tetrafunctional siloxane units, or trifunctional siloxane units and tetrafunctional siloxane units, or difunctional siloxane units, trifunctional siloxane units and tetrafunctional siloxane units. Further, tetrafunctional siloxane units are preferably 15 mol % or more, more preferably 20 to 60 mol %, based on total siloxane units. To coat the inorganic filler surface with a highly three-dimensionally crosslinked layer, it is preferable to use silicone oligomers containing trifunctional siloxane units and/or tetrafunctional siloxane units and having a polymerization degree of 6 to 70, more preferably 10 to 50.

In the method of present invention, conventional coupling agents may also be used as surface treating agents together with the silicone oligomers. Such coupling agents are, for example, silane coupling agents and titanate coupling agents. Some examples of the silane coupling agents which may be used include epoxysilane coupling agents, such as γ-glycidoxypropyltrimethoxysilane, aminosilane coupling agents, such as N-β-(N-vinylbenzylaminoethyl)-γ-aminopropyltrimethoxysilane.hydrochloride, cationic silane coupling agents, vinylsilane coupling agents, acrylsilane coupling agents, mercaptosilane coupling agents, and mixtures thereof. An example of the titanate coupling agents is isopropyltris(dioctylpyrophosphate) titanate. These may be used individually or in a combination of two or more in desired ratios.

In cases where such coupling agents are used together with the silicone oligomers, the weight ratio of coupling agent:silicone oligomer is not particularly limited, and, to make both fully exhibit their respective properties, is desirably 0.001:1 to 1:0.001, preferably 0.001:1 to 1:1.

The above-described direct compounding method is also effective to some degree in improving the dispersibility of inorganic fillers treated with conventional coupling agents alone.

Solvents which may be used to prepare the treating liquid are not particularly limited, and some examples include alcohols, such as methanol and ethanol, ethers, such as ethylene glycol monomethyl ether, ketones, such as acetone, methyl ethyl ketone and methyl isobutyl ketone, amides, such as N,N-dimethylformamide, aromatic hydrocarbons, such as toluene and xylene, ethers, such as ethyl acetate, nitrites and water, which may be used individually or as a solvent mixture of two or more. The solid concentration in the treating liquid is not particularly limited and may be varied depending on the kinds of the surface treating agents used and on the desired adhesion amount of inorganic fillers. Generally, a suitable solid concentration is 0.1 to 50% by weight, preferably 0.1 to 20% by weight. If the solid concentration is less than 0.1% by weight, the surface-treatment may take little recognizable effect, and a solid concentration of more than 50% by weight may induce a deterioration in heat resistance or the like.

Inorganic fillers which may be used in the present invention are not limited, and non-limitative and preferred examples are as exemplified above.

The method of the present invention is characterized in that after inorganic fillers are treated in a treating liquid, no drying is carried out, but resin materials are compounded directly with the treating liquid to produce a resin varnish. The temperature and time of the surface-treatment is not limited and may be varied depending on the kinds of the inorganic fillers and the surface treating agents used. It is generally suitable to carry out the treatment at a temperature ranging from room temperature to 80° C. for 30 minutes or more, preferably 30 to 120 minutes.

Resin materials which may be used in the present invention are not particularly limited, and resin materials which comprise the resins or the resins and the curing agents as exemplified above are generally used. The resins may be used individually or as a mixture of two or more, and, according to demands, cure accelerators may also be added thereto. A resin material comprising these components is directly compounded with and dissolved into the treating liquid containing the treated inorganic fillers.

Cure accelerators may be selected from known ones, and the preferred examples are as exemplified above. The ratios of the resins, inorganic fillers, curing agents and cure accelerators in resin varnishes are also as described above.

At the time of compounding resin materials with the treating liquids to produce resin varnishes, solvents may further be added to control the non-volatile solid concentration. The solvents are not limited, and some examples are acetone, methyl ethyl ketone, toluene, xylene, methyl isobutyl ketone, ethyl acetate, ethylene glycol monomethyl ether, N,N-dimethylformamide, methanol and ethanol, which may be used individually or as a mixture of two or more. The amount of the additional solvents is not particularly limited, and is preferably such that the non-volatile solid concentration is 20 to 90% by weight, more preferably 50 to 80% by weight.

According to the method of the present invention where resin varnishes are produced by directly compounding a resin material with a treating liquid in which inorganic fillers were treated and are kept stay without separation nor drying, the inorganic fillers do not cohere but disperse uniformly in resin varnishes, so that the layer of the surface treating agents are maintained uniform on the inorganic filler surfaces. Since the compatibility of the surface treated inorganic fillers with resins is also improved, the blending amount of inorganic fillers can be increased. Further, this method is free from the formation of physically adsorbed layers which are formed by the oligomerization of conventional coupling agents and adversely affect the interfacial adhesion, and is also free from the uneven surface treatment layers. Further, prepregs with good appearance can be obtained since the precipitation of inorganic fillers in varnish tanks, etc. or adhesion thereof to rolls are prevented effectively. When used for the production of laminates, the resin varnishes produced by this method improve the interfacial adhesion in the laminates, and give laminates which are excellent in drilling processability and insulation properties, including electrolytic corrosion.

The inorganic filler/resin interfaces in the laminates produced by using the resin varnishes are also in the state as shown in FIG. 4.

Laminates (b) for Printed Wiring Boards

The laminate (b) of the present invention is useful for the production of printed wiring boards and is produced by impregnating a base material with a resin varnish for printed wiring boards produced by the above-described method and drying the impregnated base material to form a prepreg, superposing two or more sheets of the, with a metal foil superposed on one or both sides of the superposed sheets of the prepreg, to form a superposed composite, and then bonding the superposed composite with heat and pressure.

The method of impregnating the base material with the resin varnish is not particularly limited, and, for example, dipping, coating or spraying is suitable. The base material may be selected without limitation from those commonly used for the production of metal-clad laminates or multilayer printed wiring boards, and suitable examples are as exemplified above. Woven or non-woven fabric of glass fiber is preferable.

The base material impregnated with the resin varnish is then dried, for example, in a drying furnace, at 80 to 200° C., preferably 100 to 180° C., for 3 to 30 minutes, preferably 5 to 15 minutes, to form a prepreg.

Plural sheets of the prepreg are superposed on each other, with metal foil superposed on one or both sides of the superposed prepreg, and then bonded with heat and pressure, to produce the single-sided or double-sided metal-clad laminate (b) of the present invention. The bonding step is generally carried out at 150 to 200° C., at a pressure of 1 to 10 MPa, for 30 to 150 minutes.

Resin Compositions (A) for Printed Wiring Boards

The resin composition (A) of the present invention is useful for the production of printed wiring boards and comprises a resin material and a silicone oligomer which contains at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, has a polymerization degree of 2 to 70, and has at least one functional end group reactive to a hydroxyl group.

Resin materials which may be used in the present invention generally comprises resins or resins and curing agents therefor. The resins are not particularly limited, and the resins as exemplified above are generally used, and the curing agents as exemplified above are generally used. Cure accelerators may also be incorporated according to demands. Examples of the cure accelerators are as exemplified above. The amounts of curing agents and cure accelerators depend on, for example, the combination of those and resins. The desirable blending ratios are as described above.

Generally, the resin compositions (A) of the present invention contain three-dimensionally crosslinked silicone oligomers.

For example, preferred silicone oligomers comprise only trifunctional siloxane units, or only tetrafunctional siloxane units, or difunctional siloxane units and trifunctional siloxane units, or difunctional siloxane units and tetrafunctional siloxane units, or trifunctional siloxane units and tetrafunctional siloxane units, or difunctional siloxane units, trifunctional siloxane units and tetrafunctional siloxane units. Further, tetrafunctional siloxane units are preferably 15 mol % or more, more preferably 20 to 60 mol %, based on total siloxane units. To coat the base material surface with a highly three-dimensionally crosslinked layer, it is preferable to use silicone oligomers which contain trifunctional siloxane units and/or tetrafunctional siloxane units, and have a polymerization degree of 6 to 70, more preferably 10 to 50. Silicone oligomers with polymerization degrees of higher than 70 may form uneven layers on the base material surface.

The amount of the silicone oligomers is not particularly limited, and is preferably 0.1 to 50 parts by weight, more preferably 0.1 to 20 parts by weight, per 100 parts by weight of the resins. If the amount of silicone oligomers is less than 0.1 part by weight, the improvement in interfacial adhesion may be insufficient, and if it is more than 50 parts by weight, there may occur an decrease in heat resistance.

In addition to the silicone oligomers, additives, such as various coupling agents, may also be blended. Suitable coupling agents are, for example, the silane coupling agents and titanate coupling agents exemplified above. The amount of such coupling agents, if any, is not particularly limited, and is generally 0.001 to 50 parts by weight, preferably 0.001 to 20 parts by weight, per 100 parts by weight of the resins.

The resin compositions (A) of the present invention may further contain inorganic fillers. Inorganic fillers which may be used are not particularly limited, and examples are as exemplified above. The amount of the inorganic fillers are not particularly limited, and preferred amount is as disclosed above.

The resin compositions (A) of the present invention may be used in various forms, and when used as resin varnishes for coating or impregnating base materials, it may be used as diluted solutions dissolved in solvents. The solvents are not limited, and some examples are acetone, methyl ethyl ketone, toluene, xylene, methyl isobutyl ketone, ethyl acetate, ethylene glycol monomethyl ether, N,N-dimethylformamide, methanol, ethanol and water, which may be used individually or as a mixture of two or more. The amount of the solvents is not particularly limited, and is preferably such that the non-volatile solid concentration is 20 to 90% by weight, more preferably 50 to 80% by weight.

Laminates (c) for Printed Wiring Boards

The laminate (c) of the present invention is useful for the production of printed wiring boards and is produced by impregnating a base material with the resin composition (A) and drying the impregnated base material to form a prepreg, superposing two or more sheets of the prepreg, with a metal foil superposed on one or both sides of the superposed sheets of the prepreg, to form a superposed composite, and then bonding the superposed composite with heat and pressure.

The method of impregnating base materials with the resin composition (A) is not particularly limited. For example, solvents and other additives are added according to demands to produce a resin varnish, and a base material is impregnated with the resin varnish by dipping, coating or spraying. The base material may be selected without limitation from those commonly used for the production of metal-clad laminates or multilayer printed wiring boards, and suitable examples are as exemplified above. Woven or non-woven fabric of glass fiber is preferable.

The base material impregnated with the resin varnish is then dried, for example, in a drying furnace, at 80 to 200° C. (in cases where solvents are used, at a temperature not lower than the temperature at which the solvents can evaporate), preferably 100 to 180° C., for 3 to 30 minutes, preferably 5 to 15 minutes, to form prepreg.

Plural sheets of the resulting prepreg are superposed on each other, with metal foil superposed on one or both sides of the superposed prepreg, and then bonded with heat and pressure, to produce the single-sided or double-sided metal-clad laminate (c) of the present invention. The bonding step is generally carried out at 150 to 200° C., at a pressure of 1 to 10 MPa, for 30 to 150 minutes.

The resin compositions (A) of the present invention contain a three-dimensionally crosslinked silicone oligomer having functional end groups reactive to the hydroxyl groups on the surfaces of base materials and inorganic fillers. Therefore, the layers of surface treating agents formed on the base material/resin interface and on the inorganic filler/resin interface are not such a thin and rigid layer as that formed by conventional silane coupling agents or the like, but rather cushioning layers of the crosslinked silicone oligomer, which relieve the distortion occurring on the interfaces and allow resins to fully exhibit their excellent adhesion function. The laminates and multilayer printed wiring boards produced by using the resin compositions (A) of the present invention, therefore, are excellent in drilling processability and insulation properties.

The base material/resin interface and the inorganic filler/resin interface in the laminates produced by using the resin compositions (A) are also in the state as shown in FIG. 4.

Resin Compositions (B) for Printed Wiring Boards

The resin composition (B) of the present invention is useful for the production of printed wiring boards and contains a resin material and an inorganic filler as essential components, and is characterized in that the inorganic filler has been pretreated with a silicone oligomer which contains at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, has a polymerization degree of 2 to 70, and has at least one functional end group reactive to a hydroxyl group.

Generally, the above-described silicone oligomer is a three-dimensionally crosslinked silicone oligomer. For example, preferred silicone oligomers comprise only trifunctional siloxane units, or only tetrafunctional siloxane units, or difunctional siloxane units and trifunctional siloxane units, or difunctional siloxane units and tetrafunctional siloxane units, or trifunctional siloxane units and tetrafunctional siloxane units, or difunctional siloxane units, trifunctional siloxane units and tetrafunctional siloxane units. Further, tetrafunctional siloxane units are preferably 15 mol % or more, more preferably 20 to 60 mol %, based on total siloxane units. To coat the surfaces of inorganic fillers with a highly three-dimensionally crosslinked layer, it is preferable to use silicone oligomers which contain trifunctional siloxane units and/or tetrafunctional siloxane units, have a polymerization degree of 6 to 70, more preferably 10 to 50. Silicone oligomers with polymerization degrees of higher than 70 may form uneven layer on the inorganic filler surface.

Inorganic fillers which may be used in the present invention are not limited, and preferred examples are as exemplified above. These inorganic fillers may be used individually or as a mixture of two or more of desired ratios.

The method of treating inorganic fillers with the silicone oligomers is not particularly limited, and suitable methods are, for example, dry methods where the silicone oligomer is directly added to the inorganic filler, and a wet method where a diluted solution of the silicone oligomer is used. The adhesion amount of the silicone oligomers to inorganic fillers is not particularly limited, and a suitable adhesion amount is generally 0.01 to 5% by weight, preferably 0.01 to 2.00% by weight, based on the weight of the inorganic fillers. If it is less than 0.01% by weight, the effect of improving interfacial adhesion may be insufficient, and if it is more than 5% by weight, there may occur a decrease in heat resistance.

The surface-treatment may also be carried out by using additives, including various coupling agents, together with the silicone oligomers. Suitable coupling agents are, for example, the silane coupling agents and titanate coupling agents which were exemplified above. The additives may be used individually or in combination of two or more of desired ratios. The amount of the coupling agents, if any, is preferably such that the weight ratio of coupling agent:silicone oligomer is 0.001:1 to 1:0.001, preferably 0.001:1 to 1:1.

In cases where the surface-treatment is carried out by a wet method using a diluted solution, suitable solvents are, for example, alcohols, such as methanol and ethanol, ethers, such as ethylene glycol monomethyl ether, ketones, such as acetone, methyl ethyl ketone and methyl isobutyl ketone, amides, such as N,N-dimethylformamide, aromatic hydrocarbons, such as toluene and xylene, ethers, such as ethyl acetate, nitrites and water. The amount of solvents, if any, is not particularly limited, and is preferably such that the concentration of non-volatile solids, including the silicone oligomers, is 0.01 to 50% by weight, more preferably 0.05 to 10% by weight. After the silicone oligomers and the optional coupling agents adhered to the surfaces of inorganic fillers by the dry or wet method, drying with heat is generally carried out at 50 to 200° C., preferably 80 to 150° C., for 5 to 60 minutes, preferably 10 to 30 minutes.

Resin materials which may be used in the present invention are not particularly limited, and the resins as exemplified above are generally used, together with additives, such as curing agents and cure accelerators, according to demands.

Suitable examples of the curing agents and cure accelerators are the same as exemplified above, and these may also be used individually or as a mixture of two or more. The amounts of the curing agents and the cure accelerators depend, for example, on the combinations of the resins and these agents. The preferred amounts are as described above.

In the resin composition (B) of the present invention, the ratio of the treated inorganic filler to the resin material is generally such that the treated inorganic filler is 1.0 to 500 parts by weight, preferably 10 to 100 parts by weight, per 100 parts by weight of the resins in the resin material.

The resin compositions (B) of the present invention may be used in various forms, and when used as resin varnishes for coating or impregnating base materials, they may be used as diluted solutions dissolved in solvents.

Solvents which may be used are not limited, and some examples are alcohols, such as methanol and ethanol, ethers, such as ethylene glycol monomethyl ether, ketones, such as acetone, methyl ethyl ketone and methyl isobutyl ketone, amides, such as N,N-dimethylformamide, aromatic hydrocarbons, such as toluene and xylene, ethers, such as ethyl acetate, and nitrites, which may be used individually or as a mixture of two or more. The amount of the solvents is not particularly limited, and is preferably such that the non-volatile solid concentration is 20 to 90% by weight, more preferably 50 to 80% by weight.

Laminates (d) for Printed Wiring Boards

The laminate (d) of the present invention is useful for the production of printed wiring boards and is produced by impregnating a base material with the resin composition (B) and drying the impregnated base material to form a prepreg, superposing two or more sheets of the prepreg, with a metal foil superposed on one or both sides of the superposed sheets of the prepreg, to form a superposed composite, and then bonding the superposed composite with heat and pressure.

The method of impregnating base materials with the resin composition (B) is not particularly limited. For example, solvents and other additives are added according to demands to produce a resin varnish, and a base material is impregnated with the resin varnish by dipping, coating or spraying. The base material may be selected without limitation from those commonly used for the production of metal-clad laminates or multilayer printed wiring boards, and suitable examples are as exemplified above. Woven or non-woven fabric of glass fiber is preferable.

The base material impregnated with the resin varnish is then dried, for example, in a drying furnace, at 80 to 200° C., preferably 100 to 180° C. (if solvents are used, at a temperature not lower than the temperature at which the solvents can evaporate), for 3 to 30 minutes, preferably 5 to 15 minutes, to form a prepreg.

Plural sheets of the obtained prepreg are superposed on each other, with metal foil superposed on one or both sides of the superposed prepreg, and then bonded with heat and pressure, to produce the laminate (d) of the present invention. When the metal foil is superposed on one side, a single-sided metal-clad laminate is obtained, and when the metal foil is superposed on both sides, a double-sided metal-clad laminate is obtained. The bonding step is generally carried out at 150 to 200° C., at a pressure of 1 to 10 MPa, for 30 to 150 minutes.

The resin compositions (B) of the present invention contain a three-dimensionally crosslinked silicone oligomer having functional end groups reactive to the hydroxyl groups on the surfaces of inorganic fillers. Therefore, the surface treating agent layer formed on the inorganic filler/resin interface is not such a thin and rigid layer as that formed by conventional silane coupling agents or the like, but rather a cushioning layer of the crosslinked silicone oligomer, which relieves the distortion occurring on the interface and makes resins fully exhibit their excellent adhesion function. The laminates and multilayer printed wiring boards produced by using the resin compositions (B) of the present invention, therefore, are excellent in drilling processability and insulation properties.

The inorganic filler/resin interface in the laminates produced by using the resin compositions (B) is also in the state as shown in FIG. 4.

Hereinafter, the present invention will be described in detail referring to working examples, which, however, do not limit the scope of the present invention.

(I) Examples of the Method of Producing Prepregs for Printed Wiring Boards and Examples of the Laminate Produced by Using the Prepregs, and Comparative Examples

EXAMPLE I-1

To a glass flask equipped with a stirring apparatus, a condenser and a thermometer was introduced a solution of 40 g of tetramethoxysilane dissolved in 93 g of ethanol, and after 0.47 g of acetic acid and 18.9 g of distilled water were added thereto, the mixture was then stirred at 50° C. for 8 hours, to synthesize a silicone oligomer having a polymerization degree of 20 (conversion from the weight average molecular weight determined by GPC, and the same shall apply hereinafter) of siloxane units. The functional end groups of the silicone oligomer, which are reactive to hydroxyl groups, are methoxy groups and/or silanol groups.

Methanol was added to the silicone oligomer, to prepare a treating liquid with a solid content of 1% by weight.

EXAMPLE I-2

By using the same reactor as used in Example I-1, 0.53 g of acetic acid and 15.8 g of distilled water were added to a solution of 40 g of trimethoxymethylsilane dissolved in 93 g of methanol, and the mixture was then stirred at 50° C. for 8 hours, to synthesize a silicone oligomer having a polymerization degree of 15 of siloxane units. The functional end groups of the silicone oligomer, which are reactive to hydroxyl groups, are methoxy groups and/or silanol groups.

Methanol was added to the silicone oligomer, to prepare a treating liquid with a solid content of 1% by weight.

EXAMPLE I-3

By using the same reactor as used in Example I-1, 0.60 g of acetic acid and 14.0 g of distilled water were added to a solution of 34 g of dimethoxydimethylsilane and 8 g of tetramethoxysilane dissolved in 98 g of methanol, and the mixture was then stirred at 50° C. for 8 hours, to synthesize a silicone oligomer having a polymerization degree of 28 of siloxane units. The functional end groups of the silicone oligomer, which are reactive to hydroxyl groups, are methoxy groups and/or silanol groups.

Methanol was added to the silicone oligomer, to prepare a treating liquid with a solid content of 1% by weight.

EXAMPLE I-4

By using the same reactor as used in Example I-1, 0.60 g of acetic acid and 17.8 g of distilled water were added to a solution of 20 g of dimethoxydimethylsilane and 25 g of tetramethoxysilane dissolved in 105 g of methanol, and the mixture was then stirred at 50° C. for 8 hours, to synthesize a silicone oligomer having a polymerization degree of 30 of siloxane units. The functional end groups of the silicone oligomer, which are reactive to hydroxyl groups, are methoxy groups and/or silanol groups.

Methanol was added to the silicone oligomer, to prepare a treating liquid with a solid content of 1% by weight.

EXAMPLE I-5

By using the same reactor as used in Example I-1, 0.52 g of acetic acid and 18.3 g of distilled water were added to a solution of 20 g of trimethoxymethylsilane and 22 g of tetramethoxysilane dissolved in 98 g of methanol, and the mixture was then stirred at 50° C. for 8 hours, to synthesize a silicone oligomer having a polymerization degree of 25 of siloxane units. The functional end groups of the silicone oligomer, which are reactive to hydroxyl groups, are methoxy groups and/or silanol groups.

Methanol was added to the silicone oligomer, to prepare a treating liquid with a solid content of 1% by weight.

EXAMPLE I-6

By using the same reactor as used in Example I-1, 0.52 g of acetic acid and 16.5 g of distilled water were added to a solution of 10 g of dimethoxydimethylsilane, 10 g of trimethoxymethylsilane and 20 g of tetramethoxysilane dissolved in 93 g of methanol, and the mixture was then stirred at 50° C. for 8 hours, to synthesize a silicone oligomer having a polymerization degree of 23 of siloxane units. The functional end groups of the siloxane oligomer, which are reactive to hydroxyl groups, are methoxy groups and/or silanol groups.

Methanol was added to the silicone oligomer, to prepare a treating liquid with a solid content of 1% by weight.

EXAMPLE I-7

To the silicone oligomer solution obtained in Example I-4 were added γ-glycidoxypropyltrimethoxysilane (Trade name: A-187, produced by Nippon Unicar Co., Ltd.), as a silane coupling agent, and methanol, to prepare a treating liquid with a solid content of 1% by weight (silicone oligomer:A-187=1:0.5 weight ratio).

EXAMPLE I-8

To the silicone oligomer solution obtained in Example I-4 were added N-β-(N-vinylbenzylaminoethyl)-γ-aminopropyltrimethoxysila.neohydrochloride (Trade name: SZ-6032, produced by Toray*Dow Corning*Silicone Co., Ltd.), as a silane coupling agent, and methanol, to prepare a treating liquid with a solid content of 1% by weight (silicone oligomer:SZ-6032=1:0.5 weight ratio).

A glass fabric of 0.2 mm thickness degreased by heating at 400° C. for 24 hours was dipped in each of the treating liquids obtained in Examples I-1 to 8, and was then dried by heating at 120° C. for 30 minutes, to obtain a glass fabric the surface of which was coated with a silicone oligomer or a silicone oligomer/coupling agent mixture. The adhesion amounts of the silicone oligomers in the treated glass fabrics were 0.08 to 0.11% by weight.

EXAMPLE I-9

The glass fabric treated with the treating liquid of Example I-4 (adhesion amount of silicone oligomer: 0.08% by weight) was further dipped in an aqueous solution containing 0.5% by weight of γ-glycidoxypropyl- trimethoxysilane (Trade name: A-187, produced by Nippon Unicar Co., Ltd.), as a silane coupling agent, and 0.5% by weight of acetic acid, and was then dried by heating at 120° C. for 30 minutes, to obtain a glass fabric the surface of which was treated with a silicone oligomer and a silane coupling agent. The adhesion amount of the silane coupling agent was 0.05% by weight.

EXAMPLE I-10

The glass fabric treated with the treating liquid of Example I-4 (adhesion amount of silicone oligomer: 0.08% by weight) was further dipped in an aqueous solution containing 0.5% by weight of N-β-(N-vinylbenzylaminoethyl)-γ-aminopropyltrimethoxysilane. hydrochloride (Trade name: SZ-6032, produced by Toray*Dow Corning*Silicone Co., Ltd.), as a silane coupling agent, and 0.5% by weight of acetic acid, and was then dried by heating at 120° C. for 30 minutes, to obtain a glass fabric the surface of which was treated with a silicone oligomer and a silane coupling agent. The adhesion amount of the silane coupling agent was 0.04% by weight.

EXAMPLE I-11

A glass fabric of 0.2 mm thickness degreased by heating at 400° C. for 24 hours was dipped in the aqueous solution which was the same as that used in Example I-9 and contained γ-glycidoxypropyltrimethoxysilane (Trade name: A-187, produced by Nippon Unicar Co., Ltd.), as a silane coupling agent, and was then dried by heating at 120° C. for 30 minutes, to obtain a glass fabric the surface of which was coated with the coupling agent in an adhesion amount of 0.1% by weight. The surface-treated glass fabric was then dipped in the treating liquid produced in Example I-4, and dried by heating at 120° C. for 30 minutes, to obtain a glass fabric the surface of which was further coated with the silicone oligomer. The adhesion amount of the silicone oligomer was 0.04% by weight.

EXAMPLE I-12

A glass fabric of 0.2 mm thickness degreased by heating at 400° C. for 24 hours was dipped in the aqueous solution which was the same as that used in Example I-10 and contained N-β-(N-vinylbenzylaminoethyl)-γ-aminopropyltrimethoxysilane.hydrochloride (Trade name: SZ-6032, produced by Toray*Dow Corning*Silicone Co., Ltd.), as a silane coupling agent, and was then dried by heating at 120° C. for 30 minutes, to obtain a glass fabric the surface of which was coated with the coupling agent in an adhesion amount of 0.1% by weight. The surface-treated glass fabric was then dipped in the treating liquid produced in Example I-4, and dried by heating at 120° C. for 30 minutes, to obtain a glass fabric the surface of which was further coated with the silicone oligomer. The adhesion amount of the silicone oligomer was 0.03% by weight.

COMPARATIVE EXAMPLE I-1

As a glass fabric base material, the glass fabric of 0.2 mm thickness and with an adhesion amount of γ-glycidoxypropyltrimethoxysilane (Trade name: A-187, produced by Nippon Unicar Co., Ltd.) of 0.1% by weight, which was the same as that used in Example I-11, was used.

COMPARATIVE EXAMPLE I-2

As a glass fabric base material, the glass fabric of 0.2 mm thickness and with an adhesion amount of N-β-(N-vinylbenzylaminoethyl)-γ-aminopropyltrimethoxysilane. hydrochloride (Trade name: SZ-6032, produced by Toray*Dow Corning*Silicone Co., Ltd.) of 0.1% by weight, which was the same as that used in Example I-12, was used.

COMPARATIVE EXAMPLE I-3

In place of a silicone oligomer treating liquid, a methanol solution containing 1.0% by weight of an epoxy-modified silicone oil (Trade name: KF101, produced by Shin-Etsu Chemical Co., Ltd.) was prepared as a treating liquid. A glass fabric of 0.2 mm thickness degreased by heating at 400° C. for 24 hours was dipped in the treating liquid, and was then dried by heating at 120° C. for 30 minutes, to obtain a glass fabric the surface of which was coated with the silicone oil. The adhesion amount of the silicone oil was 0.12% by weight.

The glass fabrics obtained in Examples I-1 to 12 and Comparative Examples I-1 to 3 were impregnated with the following epoxy resin varnish, and then dried by heating at 140° C. for 5 to 10 minutes, to obtain prepregs of a resinous solid content of 41% by weight. Four sheets of each prepreg were superposed on each other, with copper foil of 35 μm thickness superposed on each side of the superposed prepreg, and then bonding was performed under the pressing conditions of 170° C., 90 minutes and 4.0 MPa, to produce double-sided copper-clad laminates.
Brominated bisphenol A epoxy resin (epoxy equivalent weight:

530): 100 parts by weight
Dicyandiamide: 4 parts by weight
2-ethyl-4-methylimidazole: 0.5 parts by weight These compounds were dissolved in a solvent mixture of methyl ethyl ketone/ethylene glycol monomethyl ether (1/1 weight ratio), to prepare a resin varnish with a non-volatile solid content of 70% by weight, which was used as the above-described epoxy resin varnish.

The obtained double-sided copper-clad laminates were examined for drilling processability, water absorption, soldering heat resistance and insulation resistance. The results are listed in Table I-1.

TABLE I-1

Properties of laminates

| | Drilling processability (crack %) | Water absorption (wt %) | Soldering heat resistance | Installation resistance (Ω) Normal state | Installation resistance (Ω) After 5-hr PCT |
|---|---|---|---|---|---|
| Example No. | | | | | |
| I-1 | 20 | 0.72 | OK | $6.1 \times 10^{15}$ | $6.7 \times 10^{13}$ |
| I-2 | 25 | 0.70 | OK | $6.4 \times 10^{15}$ | $6.9 \times 10^{13}$ |
| I-3 | 27 | 0.70 | OK | $7.3 \times 10^{15}$ | $7.2 \times 10^{13}$ |
| I-4 | 23 | 0.68 | OK | $7.0 \times 10^{15}$ | $6.9 \times 10^{13}$ |
| I-5 | 22 | 0.71 | OK | $6.2 \times 10^{15}$ | $7.0 \times 10^{13}$ |
| I-6 | 19 | 0.69 | OK | $6.9 \times 10^{15}$ | $7.3 \times 10^{13}$ |
| I-7 | 28 | 0.61 | OK | $7.1 \times 10^{15}$ | $7.1 \times 10^{13}$ |
| I-8 | 26 | 0.62 | OK | $7.2 \times 10^{15}$ | $7.2 \times 10^{13}$ |
| I-9 | 22 | 0.65 | OK | $7.5 \times 10^{15}$ | $7.4 \times 10^{13}$ |
| I-10 | 21 | 0.66 | OK | $8.0 \times 10^{15}$ | $7.5 \times 10^{13}$ |
| I-11 | 30 | 0.70 | OK | $6.8 \times 10^{15}$ | $7.0 \times 10^{13}$ |
| I-12 | 29 | 0.72 | OK | $7.0 \times 10^{15}$ | $7.1 \times 10^{13}$ |
| Comparative Example No. | | | | | |
| I-1 | 48 | 0.69 | OK | $7.6 \times 10^{15}$ | $8.5 \times 10^{12}$ |
| I-2 | 45 | 0.71 | OK | $8.1 \times 10^{15}$ | $1.5 \times 10^{13}$ |
| I-3 | 63 | 1.05 | NG | $5.5 \times 10^{14}$ | $5.5 \times 10^{11}$ |

Each test was carried out as follows. Except in the tests for electrolytic corrosion resistance, test pieces from which copper foil was completely etched off were used.

Drilling processability: After through holes were made by using a drill of φ0.4 mm at 80,000 r.p.m. and at a feed rate of 3,200 mm/min, the hole walls were examined for cracks which were made by, for example, the peeling on the base material/resin interfaces. The examination for the cracks in the hole walls was carried out by boiling each drilled test piece in a red checking liquid for an hour, microscopically observing the wall surfaces, and determining the percentage of the soaked area on the hole walls (average of the values of 20 holes). unit: %

Water absorption: was calculated from the difference between the weight at a normal state and the weight after a two-hours pressure cooker test (121° C., 2 atm). unit: % by weight Soldering heat resistance: After a two-hours pressure cooker test (121° C., 2 atm), each test piece was dipped in a solder bath of 260° C. for 20 seconds, and its surfaces were visually observed. In the table, "OK" means the absence of measling or blistering.

Insulation resistance: Both at a normal state and after a five-hours pressure cooker test (121° C., 2 atm), each test piece was applied with a voltage of 500 V for one minute, and the insulation resistance was then measured. unit: Ω

As to Example I-1 and Comparative Example I-2, tests for electrolytic corrosion resistance were carried out.

Electrolytic corrosion resistance: Each laminate was drilled by using a drill of φ0.4 mm to make 300 through holes in total arranged so that six lines each including 50 holes (pitch between holes: 1.0 mm) were lined in columns with a space of a hole pitch of 0.7 mm. The through holes were copper-plated to 35 μm thickness by conventional electroless plating and electric plating. The laminate was then wired by photolithography so that the 50 through holes in each line were connected in a form of connected cranks with lands of 0.6 mm diameter and connecting lines of 0.1 mm width. The wired lines were connected alternately one another, and 100 V was applied at 85° C./85% RH by using one group of the connected lines as anodes and the other group as cathodes.

In Comparative Example I-2, continuity breakdown due to CAF (Conductive Anodic Filament) took place about 1200 hours later, while in Example I-1, the insulation resistance was $10^{10}$ Ω or more even 1500 hours later.

The results show that the copper-clad laminates obtained in Examples I-1 to 12 had sufficient soldering heat resistance, were hardly cracked by drilling, lost little insulation resistance by water absorption and had improved electrolytic corrosion resistance.

The prepregs for printed wiring boards produced by the method of the present invention can improve the laminates produced by using the prepregs in drilling processability and in insulation properties including electrolytic corrosion resistance, without deteriorating the properties of the conventional laminates.

(II) Examples of the Method of Producing Resin Varnishes for Printed Wiring Boards and Laminates Produced by Using the Resin Varnish. Referential Examples and Comparative Examples

REFERENTIAL EXAMPLE II-1

To a glass flask equipped with a stirring apparatus, a condenser and a thermometer were introduced γ-glycidoxypropyltrimethoxysilane (Trade name: A-187, produced by Nippon Unicar Co., Ltd.), as a silane coupling agent, and methyl ethyl ketone, to produce a treating liquid of a solid content of 10% by weight. Calcined clay (mean particle size: 1.2 μm) was added to the treating liquid in an amount of 50% by weight based on the resinous solid, and the mixture was then stirred for one hour at room temperature, to produce a treating liquid containing a surface-treated inorganic filler.

REFERENTIAL EXAMPLE II-2

To a glass flask equipped with a stirring apparatus, a condenser and a thermometer were introduced N-β-(N-vinylbenzylaminoethyl)-γ-aminopropyltrimethoxysilane. hydrochloride (Trade name: SZ-6032, produced by Toray*Dow Corning*Silicone Co., Ltd.), as a silane coupling agent, and methyl ethyl ketone, to produce a treating liquid of a solid content of 10% by weight. Calcined clay (mean particle size: 1.2 μm) was added to the treating liquid in an amount of 50% by weight based on the resinous solid, and the mixture was then stirred for one hour at room temperature, to produce a treating liquid containing a surface-treated inorganic filler.

REFERENTIAL EXAMPLE II-3

To a glass flask equipped with a stirring apparatus, a condenser and a thermometer were introduced isopropyltris (dioctylpyrophosphate) titanate (Trade name: KR46B, produced by Ajinomoto Co., Ltd.), as a titanate coupling agent, and methyl ethyl ketone, to produce a treating liquid of a solid content of 10% by weight. Calcined clay (mean particle size: 1.2 μm) was added to the treating liquid in an amount of 50% by weight based on the resinous solid, and the mixture was then stirred for one hour at room temperature, to produce a treating liquid containing a surface-treated inorganic filler.

EXAMPLE II-1

In a glass flask equipped with a stirring apparatus, a condenser and a thermometer was introduced a solution of 40 g of tetramethoxysilane dissolved in 93 g of methanol, and after 0.47 g of acetic acid and 18.9 g of distilled water were added thereto, the mixture was stirred for 8 hours at 50° C., to synthesize a silicone oligomer having a polymerization degree of siloxane units of 20 (conversion from the weight average molecular weight determined by GPC, and the same shall apply hereinafter). The functional end groups of the silicone oligomer, which are reactive to hydroxyl groups, are methoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

EXAMPLE II-2

By using the same reactor as used in Example II-1, 0.53 g of acetic acid and 15.8 g of distilled water were added to a solution of 40 g of trimethoxymethylsilane dissolved in 93 g of methanol, and the mixture was then stirred for 8 hours at 50° C., to synthesize a silicone oligomer having a polymerization degree of siloxane units of 15. The functional end groups of the silicone oligomer, which are reactive to hydroxyl groups, are methoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

EXAMPLE II-3

By using the same reactor as used in Example II-1, 0.60 g of acetic acid and 14.0 g of distilled water were added to a solution containing 34 g of dimethoxydimethylsilane and 8 g of tetramethoxysilane dissolved in 98 g of methanol, and the mixture was then stirred for 8 hours at 50° C., to synthesize a silicone oligomer having a polymerization degree of siloxane units of 28. The functional end groups of the silicone oligomer, which are reactive to hydroxyl groups, are methoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

EXAMPLE II-4

By using the same reactor as used in Example II-1, 0.60 g of acetic acid and 17.8 g of distilled water were added to a solution containing 20 g of dimethoxydimethylsilane and 25 g of tetramethoxysilane dissolved in 105 g of methanol, and the mixture was then stirred for 8 hours at 50° C., to synthesize a silicone oligomer having a polymerization degree of siloxane units of 30. The functional end groups of the silicone oligomer, which are reactive to hydroxyl groups, are methoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

EXAMPLE II-5

By using the same reactor as used in Example II-1, 0.52 g of acetic acid and 18.3 g of distilled water were added to a solution containing 20 g of trimethoxymethylsilane and 22 g of tetramethoxysilane dissolved in 98 g of methanol, and the mixture was then stirred for 8 hours at 50° C., to synthesize a silicone oligomer having a polymerization degree of siloxane units of 25. The functional end groups of the silicone oligomer, which are reactive to hydroxyl groups, are methoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

EXAMPLE II-6

By using the same reactor as used in Example II-1, 0.52 g of acetic acid and 16.5 g of distilled water were added to a solution containing 10 g of dimethoxydimethylsilane, 10 g of trimethoxymethylsilane and 20 g of tetramethoxysilane dissolved in 93 g of methanol, and the mixture was then stirred for 8 hours at 50° C., to synthesize a silicone oligomer having a polymerization degree of siloxane units of 23. The functional end groups of the silicone oligomer, which are reactive to hydroxyl groups, are methoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

EXAMPLE II-7

By using the same reactor as used in Example II-1, 0.34 g of acetic acid and 13.8 g of distilled water were added to a solution containing 40 g of tetraethoxysilane dissolved in 93 g of methanol, and the mixture was then stirred for 8 hours at 50° C., to synthesize a silicone oligomer having a polymerization degree of siloxane units of 19. The functional end groups of the silicone oligomer, which are reactive to hydroxyl groups, are ethoxy groups and/or silanol groups.

Methyl ethyl ketone was added to the obtained silicone oligomer solution, to produce a treating liquid of a solid content of 10% by weight. Calcined clay was added to the treating liquid in an amount of 50% by weight based on the resinous solid, and the mixture was then stirred for one hour at room temperature, to produce a treating liquid containing a surface-treated inorganic filler.

REFERENTIAL EXAMPLE II-4

The procedure of Referential Example II-1 was repeated, except that talc (mean particle size: 12 μm) was used as the inorganic filler, to produce a treating liquid containing a surface-treated inorganic filler.

REFERENTIAL EXAMPLE II-5

The procedure of Referential Example II-1 was repeated, except that silica (mean particle size: 1.0 μm) was used as the inorganic filler, to produce a treating liquid containing a surface-treated inorganic filler.

EXAMPLE II-8

To the silicone oligomer solution obtained in Example II-1 were added γ-glycidoxypropyltrimethoxysilane (Trade name: A-187), as a silane coupling agent, and methyl ethyl ketone, to produce a treating liquid having a solid content of 10% by weight (silicone oligomer:A-187=1:1 weight ratio). Calcined clay was added to the treating liquid in an amount of 50% by weight based on the resinous solids, and the mixture was stirred for one hour at room temperature, to obtain a treating liquid containing a surface-treated inorganic filler.

EXAMPLE II-9

To the silicone oligomer solution obtained in Example II-1 were added isopropyltris(dioctylpyrophosphate) titanate (Trade name: KR46B), as a titanate coupling agent, and methyl ethyl ketone, to produce a treating liquid having a solid content of 10% by weight (silicone oligomer:KR46B= 1:1 weight ratio). Calcined clay was added to the treating liquid in an amount of 50% by weight based on the resinous solids, and the mixture was stirred for one hour at room temperature, to obtain a treating liquid containing a surface-treated inorganic filler.

The treating liquids, which were obtained in Examples II-1 to 9 and Referential Examples II-1 to 5 and contained surface-treated inorganic fillers, were heated to 50° C., and the following resin material and a solvent mixture of methyl ethyl ketone/ethylene glycol monomethyl ether (1:1 weight ratio) were added thereto, to produce resin varnishes of a solid content of 70% by weight.

Brominated bisphenol A epoxy resin (epoxy equivalent weight:
530): 100 parts by weight
Dicyandiamide: 4 parts by weight
2-ethyl-4-methylimidazole: 0.5 parts by weight

COMPARATIVE EXAMPLE II-1

Calcined clay, the surface of which had not been treated, was mixed into a solvent mixture of methyl ethyl ketone/ ethylene glycol monomethyl ether (1:1 weight ratio) to a content of 50% by weight, and the above-described resin material was then added thereto, to produce a resin varnish of a solid content of 70% by weight.

COMPARATIVE EXAMPLE II-2

To 100 parts by weight of the resin varnish produced in Comparative Example II-1 was added 2 parts by weight of γ-glycidoxypropyltrimethoxysilane as a silane coupling agent.

COMPARATIVE EXAMPLE II-3

A resin varnish was produced in the same manner as in Referential Example II-1, except that the calcined clay was treated with an epoxy-modified silicone oil (Trade name: KF101, produced by Shin-Etsu Chemical Co., Ltd.) in place of the silane coupling agent.

COMPARATIVE EXAMPLE II-4

The silane coupling agent used in Referential Example II-1, namely γ-glycidoxypropyltrimethoxysilane, was dissolved in methanol to produce a treating liquid of a solid content of 1% by weight, wherein calcined clay the surface of which had not been treated was dipped for one hour with stirring and was then dried at 120° C. for one hour. A resin varnish was produced in the same manner as in Comparative Example II-1, except that the treated, calcined clay was used.

A glass fabric of about 0.2 mm thickness was impregnated with each of the resin varnishes produced in Examples II-1 to 9, Referential Examples II-1 to 5 and Comparative Examples II-1 to 4 to obtain impregnated glass fabrics, which were then heated to 140° C. for 5 to 10 minutes to dry, to obtain prepregs of a resin content of 41% by weight. Four sheets of each prepreg were superposed on each other, with copper foil of 35 μm thickness superposed on each side of the superposed prepreg, and then bonding was performed under the pressing conditions of 170° C., 90 minutes and 4.0 MPa, to produce double-sided copper-clad laminates.

The obtained double-sided copper-clad laminates were examined for drilling processability, water absorption, soldering heat resistance and electrolytic corrosion resistance. The results are listed in Tables II-1 and II-2.

TABLE II-1

|  | Referential Examples | | | Examples | | | | | |
| --- | --- | --- | --- | --- | --- | --- | --- | --- | --- |
|  | II-1 | II-2 | II-3 | II-1 | II-2 | II-3 | II-4 | II-5 | II-6 |
| Coating quality | NG | NG | NG | Good | Good | Good | Good | Good | Good |
| Appearance of prepreg | Good | Good | Good | Good | Good | Good | Good | Good | Good |
| Drilling processability (crack %) | 24 | 22 | 25 | 18 | 22 | 21 | 17 | 18 | 16 |
| Water absorption (wt %) | 0.71 | 0.70 | 0.75 | 0.74 | 0.71 | 0.70 | 0.73 | 0.73 | 0.71 |
| Soldering heat resistance | OK | OK | OK | OK | OK | OK | OK | OK | OK |
| Electrolytic corrosion resistance (hr) | >500 | >500 | >500 | >500 | >500 | >500 | >500 | >500 | >500 |

TABLE II-2

|  | Example | Ref. Exs. | | Examples | | Comparative Examples | | | |
| --- | --- | --- | --- | --- | --- | --- | --- | --- | --- |
|  | II-7 | II-4 | II-5 | II-8 | II-9 | II-1 | II-2 | II-3 | II-4 |
| Coating quality | Good | Good | Good | Good | Good | NG | NG | NG | NG |
| Appearance of prepreg | Good | Good | Good | Good | Good | NG | NG | NG | NG |
| Drilling processability (crack %) | 19 | 23 | 24 | 23 | 23 | 38 | 37 | 40 | 36 |
| Water absorption (wt %) | 0.70 | 0.74 | 0.73 | 0.69 | 0.68 | 0.88 | 0.88 | 0.95 | 0.80 |
| Soldering heat resistance | OK | OK | OK | OK | OK | OK | OK | OK | OK |
| Electrolytic corrosion resistance (hr) | >500 | >500 | >500 | >500 | >500 | 288 | 288 | 216 | 360 |

Each test was carried out as follows. The coating quality and appearance of the prepregs were evaluated previously by visual observations. As to the coating quality, the prepregs which did not cause adhesion of inorganic fillers to rolls were rated as "Good", and the prepregs which caused such adhesion more or less as "NG". As to the appearance of prepregs, prepregs which had the same even surfaces as of those containing no inorganic fillers were rated as "Good", the others as "NG".

Except in the tests for electrolytic corrosion resistance, test pieces from which copper foil was completely etched off were used.

Drilling processability: After through holes were made by using a drill of ϕ0.4 mm at 80,000 r.p.m. and at a feed rate of 3,200 mm/min, the hole walls were examined for cracks which were made by, for example, the peeling on the base material/resin interfaces. The examination for the cracks in the hole walls was carried out by boiling each drilled test piece in a red checking liquid for an hour, microscopically observing the wall surfaces, and determining the percentage of the soaked area on the hole walls (average of 20 holes). unit: %

Water absorption: was calculated from the difference between the weight at a normal state and the weight after a two-hours pressure cooker test (121° C., 2 atm). unit: % by weight Soldering heat resistance: After a two-hours pressure cooker test (121° C., 2 atm), each test piece was dipped in a solder bath of 260° C. for 20 seconds, and the surfaces thereof were visually observed. In the table, "OK" means the absence of measling or blistering.

Electrolytic corrosion resistance: In the same manner as described above, the time taken to cause continuity breakdown by application of 100 V at 85° C./85%RH was measured. Also, the continuity breakdown was confirmed to be caused by the CAF (Conductive Anodic filament) between through holes.

The results show that the prepregs of Examples II-1 to 9 and Referential Examples II-1 to 5 had good appearance, and the laminates produced by using these prepregs had sufficient soldering heat resistance, absorbed little water, were hardly cracked by drilling, and had improved electrolytic corrosion resistance. Particularly, the prepregs produced in Examples II-1 to 9 caused no adhesion of inorganic fillers to rolls, and were particularly improved in coating quality.

The prepregs which are produced by using the resin varnishes produced by the method of the present invention are excellent in appearance, and can improve the laminates produced by using them in drilling processability and in insulation properties including electrolytic corrosion resistance, without deteriorating the properties of the conventional laminates.

(III) Examples of Resin Compositions (A) for Printed Wiring Boards and Laminates Produced by Using the Resin Compositions (A), and Comparative Examples

EXAMPLE III-1

To a glass flask equipped with a stirring apparatus, a condenser and a thermometer was introduced a solution containing 40 g of tetramethoxysilane dissolved in 93 g of methanol, and after 0.47 g of acetic acid and 18.9 g of distilled water were added thereto, the mixture was stirred for 8 hours at 50° C., to synthesize a silicone oligomer having a polymerization degree of siloxane units of 20 (conversion from the weight average molecular weight determined by GPC, and the same shall apply hereinafter). The functional end groups of the silicone oligomer, which are reactive to hydroxyl groups, are methoxy groups and/or silanol groups.

EXAMPLE III-2

By using the same reactor as used in Example III-1, 0.53 g of acetic acid and 15.8 g of distilled water were added to a solution of 40 g of trimethoxymethylsilane dissolved in 93 g of methanol, and the mixture was then stirred for 8 hours at 50° C., to synthesize a silicone oligomer having a polymerization degree of siloxane units of 15. The functional end groups of the silicone oligomer, which are reactive to hydroxyl groups, are methoxy groups and/or silanol groups.

EXAMPLE III-3

By using the same reactor as used in Example III-1, 0.60 g of acetic acid and 14.0 g of distilled water were added to a solution containing 34 g of dimethoxydimethylsilane and 8 g of tetramethoxysilane dissolved in 98 g of methanol, and the mixture was then stirred for 8 hours at 50° C., to synthesize a silicone oligomer having a polymerization degree of siloxane units of 28. The functional end groups of the silicone oligomer, which are reactive to hydroxyl groups, are methoxy groups and/or silanol groups.

EXAMPLE III-4

By using the same reactor as used in Example III-1, 0.60 g of acetic acid and 17.8 g of distilled water were added to a solution containing 20 g of 61 dimethoxydimethylsilane and 25 g of tetramethoxysilane dissolved in 105 g of methanol, and the mixture was then stirred for 8 hours at 50° C., to synthesize a silicone oligomer having a polymerization degree of siloxane units of 30. The functional end groups of the silicone oligomer, which are reactive to hydroxyl groups, are methoxy groups and/or silanol groups.

EXAMPLE III-5

By using the same reactor as used in Example III-1, 0.52 g of acetic acid and 18.3 g of distilled water were added to a solution containing 20 g of trimethoxymethylsilane and 22 g of tetramethoxysilane dissolved in 98 g of methanol, and the mixture was then stirred for 8 hours at 50° C., to synthesize a silicone oligomer having a polymerization degree of siloxane units of 25. The functional end groups of the silicone oligomer, which are reactive to hydroxyl groups, are methoxy groups and/or silanol groups.

EXAMPLE III-6

By using the same reactor as used in Example III-1, 0.52 g of acetic acid and 16.5 g of distilled water were added to a solution containing 10 g of dimethoxydimethylsilane, 10 g of trimethoxymethylsilane and 20 g of tetramethoxysilane dissolved in 93 g of methanol, and the mixture was then stirred for 8 hours at 50° C., to synthesize a silicone oligomer having a polymerization degree of siloxane units of 23. The functional end groups of the silicone oligomer, which are reactive to hydroxyl groups, are methoxy groups and/or silanol groups.

EXAMPLE III-7

By using the same reactor as used in Example III-1, 0.34 g of acetic acid and 13.8 g of distilled water were added to a solution containing 40 g of tetraethoxysilane dissolved in 93 g of methanol, and the mixture was then stirred for 8 hours at 50° C., to synthesize a silicone oligomer having a polymerization degree of siloxane units of 19. The functional end groups of the silicone oligomer, which are reactive to hydroxyl groups, are ethoxy groups and/or silanol groups.

By using the silicone oligomers synthesized in Examples III-1 to 7, epoxy resin varnishes containing the following components were prepared.

Brominated bisphenol A epoxy resin (epoxy equivalent weight:

530): 100 parts by weight

Dicyandiamide: 4 parts by weight

Silicone oligomer: 2 parts by weight 2-ethyl-4-methylimidazole: 0.5 parts by weight These compounds were dissolved in a methyl ethyl ketone/ethylene glycol monomethyl ether (1:1 weight ratio) solvent mixture, to produce resin varnishes of a non-volatile solid content of 70% by weight.

EXAMPLE III-8

A resin varnish was produced with the same ratios of the components as described above, except that the amount of the silicone oligomer of Example III-1 were changed to one part by weight, and one part by weight of γ-glycidoxypropyltrimethoxysilane (Trade name: A-187, produced by Nippon Unicar Co., Ltd.), as a silane coupling agent, was added thereto to produce a resin varnish of a non-volatile solid content of 70% by weight.

EXAMPLE III-9

A resin varnish was produced with the same ratios of the components as described above, except that the amount of the silicone oligomer of Example III-1 were changed to one part by weight, and one part by weight of N-β-(N-vinylbenzylaminoethyl)-γ-aminopropyltrimethoxysilane. hydrochloride (Trade:name: SZ-6032, produced by Toray*Dow Corning*Silicone Co., Ltd.), as a silane coupling agent, to produce a resin varnish of a non-volatile solid content of 70 % by weight.

EXAMPLE III-10

To the resin varnish of Example III-1 containing 2 parts by weight of the silicone oligomer, was added calcined clay (mean particle size: 1.2 μm) as an inorganic filler in an amount of 50 parts by weight per 100 parts by weight of the epoxy resin, to produce a resin varnish of a non-volatile solid content of 70% by weight.

COMPARATIVE EXAMPLE III-1

A resin varnish was produced in the same manner as in Examples III-1 to 7, except that no silicone oligomers were added.

COMPARATIVE EXAMPLE III-2

A resin varnish was produced in the same manner as in Examples III-1 to 7, except that 2 parts by weight of γ-glycidoxypropyltrimethoxysilane was used in place of the silicone oligomers.

COMPARATIVE EXAMPLE III-3

A resin varnish was produced in the same manner as in Examples III-1 to 7, except that 2 parts by weight of an epoxy-modified silicone oil (Trade name: KF101, produced by Shin-Etsu Chemical Co., Ltd. was used in place of the silicone oligomers.

COMPARATIVE EXAMPLE III-4

A resin varnish was produced in the same manner as in Example III-9, except that no silicone oligomers were used.

COMPARATIVE EXAMPLE III-5

To the resin varnish of Comparative Example III-2 was added calcined clay as an inorganic filler in an amount of 50 parts by weight per 100 parts by weight of the epoxy resin, to produce a resin varnish of a non-volatile solid content of 70% by weight.

A glass fabric of about 0.2 mm thickness was impregnated with each of the resin varnishes produced in Examples III-1 to 10 and Comparative Examples III-1 to 5 to obtain impregnated glass fabrics, which were then heated to 140° C. for 5 to 10 minutes to dry, to obtain prepregs of a resin content of 41% by weight. Four sheets of each prepreg were superposed on each other, with copper foil of 35 μm thickness superposed on each side of the superposed prepreg, and then bonding was performed under the pressing conditions of 170° C., 90 minutes and 4.0 MPa, to produce double-sided copper-clad laminates.

The obtained double-sided copper-clad laminates were examined for drilling processability, water absorption, soldering heat resistance and electrolytic corrosion resistance. The results are listed in Tables III-1 and III-2.

TABLE III-1

| | Examples | | | | | | |
|---|---|---|---|---|---|---|---|
| | III-1 | III-2 | III-3 | III-4 | III-5 | III-6 | III-7 |
| Dimethoxy-dimethylsilane (g) | — | — | 34 | 20 | — | 10 | — |
| Trimethoxy-methylsilane (g) | — | 40 | — | — | 20 | 10 | — |
| Tetramethoxysilane (g) | 40 | — | 8 | 25 | 22 | 20 | — |
| Tetraethoxysilane (g) | — | — | — | — | — | — | 40 |
| Methanol (g) | 93 | 93 | 98 | 105 | 98 | 93 | 93 |
| Acetic acid (g) | 0.47 | 0.53 | 0.60 | 0.60 | 0.52 | 0.52 | 0.34 |
| Distilled water (g) | 18.9 | 15.8 | 14.0 | 17.8 | 18.3 | 16.5 | 13.8 |
| Conditions of synthesis | 50° C., 8 hours | | | | | | |
| Siloxane repeating units | 20 | 15 | 28 | 30 | 25 | 23 | 19 |
| Epoxy resin (wt parts) | 100 | 100 | 100 | 100 | 100 | 100 | 100 |
| Silicone oligomer (wt parts) | 2 | 2 | 2 | 2 | 2 | 2 | 2 |
| A-187 (wt parts) | — | — | — | — | — | — | — |
| SZ-6032 (wt parts) | — | — | — | — | — | — | — |
| Epoxy-modified silicone oil (wt parts) | — | — | — | — | — | — | — |
| Calcined clay (wt parts) | — | — | — | — | — | — | — |
| Drilling processability (crack %) | 22 | 26 | 25 | 21 | 22 | 20 | 23 |
| Water absorption (wt %) | 0.71 | 0.68 | 0.67 | 0.70 | 0.71 | 0.68 | 0.73 |
| Soldering heat resistance | OK | OK | OK | OK | OK | OK | OK |
| Electrolytic corrosion resistance (hr) | >500 | >500 | >500 | >500 | >500 | >500 | >500 |

TABLE III-2

| | Examples | | | Comparative Examples | | | | |
|---|---|---|---|---|---|---|---|---|
| | III-8 | III-9 | III-10 | III-1 | III-2 | III-3 | III-4 | III-5 |
| Epoxy resin (wt part) | 100 | 100 | 100 | 100 | 100 | 100 | 100 | 100 |
| Silicone oligomer (Example III-1) (wt parts) | 1 | 1 | 2 | — | — | — | — | — |
| A-187 (wt parts) | 1 | — | — | — | 2 | — | — | 2 |
| SZ-6032 (wt parts) | — | 1 | — | — | — | — | 1 | — |
| Epoxy-modified silicone oil (wt parts) | — | — | — | — | — | 2 | — | — |
| Calcined clay (wt part) | — | — | 50 | — | — | — | — | 50 |
| Drilling processability (crack %) | 28 | 25 | 19 | 43 | 41 | 48 | 38 | 37 |
| Water absorption (wt %) | 0.63 | 0.62 | 0.75 | 0.70 | 0.69 | 0.75 | 1.05 | 0.88 |
| Soldering heat resistance | OK | OK | OK | OK | OK | OK | OK | OK |
| Electrolytic corrosion resistance (hr) | >500 | >500 | >500 | 360 | 336 | 315 | 192 | 288 |

A-187: γ-glycidoxypropyltrimethoxysilane
SZ-6032: N-β-(N-vinylbenzylaminoethyl)-γ-aminopropyltrimethoxysilane.hydrochloride
KF101: epoxy-modified silicone oil The tests were carried out in the same manner as in Examples II-1 to 9, Referential Examples II-1 to 5 and Comparative Examples II-1 to 4. Except in the tests for electrolytic corrosion resistance, test pieces from which copper foil was completely etched off were used.

The results show that the laminates of Examples III-1 to 10 had good appearance, and the laminates produced by using these prepregs had sufficient soldering heat resistance, were hardly cracked by drilling, and had improved electrolytic corrosion resistance.

The resin compositions (A) of the present invention can improve the laminates produced by using them in drilling processability and in insulation properties including electrolytic corrosion resistance, without deteriorating the properties of the conventional laminates.

(IV) Examples of Resin Compositions (B) for Printed Wiring Boards and Laminates Produced by Using the Resin Compositions (B). and Comparative Examples

EXAMPLE IV-1

To a glass flask equipped with a stirring apparatus, a condenser and a thermometer was introduced a solution containing 40 g of tetramethoxysilane dissolved in 93 g of methanol, and after 0.47 g of acetic acid and 18.9 g of distilled water were added thereto, the mixture was stirred for 8 hours at 50° C., to synthesize a silicone oligomer having a polymerization degree of siloxane units of 20 (conversion from the weight average molecular weight determined by GPC, and the same shall apply hereinafter). The functional end groups of the silicone oligomer, which are reactive to hydroxyl groups, are methoxy groups and/or silanol groups.

Methanol was added to the obtained silicone oligomer solution, to produce a treating liquid of a solid content of 1% by weight.

EXAMPLE IV-2

By using the same reactor as used in Example IV-1, 0.53 g of acetic acid and 15.8 g of distilled water were added to a solution of 40 g of trimethoxymethylsilane dissolved in 93 g of methanol, and the mixture was then stirred for 8 hours at 50° C., to synthesize a silicone oligomer having a polymerization degree of siloxane units of 15. The functional end groups of the silicone oligomer, which are reactive to hydroxyl groups, are methoxy groups and/or silanol groups.

Methanol was added to the obtained silicone oligomer solution, to produce a treating liquid of a solid content of 1% by weight.

EXAMPLE IV-3

By using the same reactor as used in Example IV-1, 0.60 g of acetic acid and 14.0 g of distilled water were added to a solution containing 34 g of dimethoxydimethylsilane and 8 g of tetramethoxysilane dissolved in 98 g of methanol, and the mixture was then stirred for 8 hours at 50° C., to synthesize a silicone oligomer having a polymerization degree of siloxane units of 28. The functional end groups of the silicone oligomer, which are reactive to hydroxyl groups, are methoxy groups and/or silanol groups.

Methanol was added to the obtained silicone oligomer solution, to produce a treating liquid of a solid content of 1% by weight.

EXAMPLE IV-4

By using the same reactor as used in Example IV-1, 0.60 g of acetic acid and 17.8 g of distilled water were added to a solution containing 20 g of dimethoxydimethylsilane and 25 g of tetramethoxysilane dissolved in 105 g of methanol, and the mixture was then stirred for 8 hours at 50° C., to synthesize a silicone oligomer having a polymerization degree of siloxane units of 30. The functional end groups of the silicone oligomer, which are reactive to hydroxyl groups, are methoxy groups and/or silanol groups.

Methanol was added to the obtained silicone oligomer solution, to produce a treating liquid of a solid content of 1% by weight.

EXAMPLE IV-5

By using the same reactor as used in Example IV-1, 0.52 g of acetic acid and 18.3 g of distilled water were added to a solution containing 20 g of trimethoxymethylsilane and 22 g of tetramethoxysilane dissolved in 98 g of methanol, and the mixture was then stirred for 8 hours at 50° C., to synthesize a silicone oligomer having a polymerization degree of siloxane units of 25. The functional end groups of the silicone oligomer, which are reactive to hydroxyl groups, are methoxy groups and/or silanol groups.

Methanol was added to the obtained silicone oligomer solution, to produce a treating liquid of a solid content of 1% by weight.

EXAMPLE IV-6

By using the same reactor as used in Example IV-1, 0.52 g of acetic acid and 16.5 g of distilled water were added to a solution containing 10 g of dimethoxydimethylsilane, 10 g of trimethoxymethylsilane and 20 g of tetramethoxysilane dissolved in 93 g of methanol, and the mixture was then stirred for 8 hours at 50° C., to synthesize a silicone oligomer having a polymerization degree of siloxane units of 23. The functional end groups of the silicone oligomer, which are reactive to hydroxyl groups, are methoxy groups and/or silanol groups.

Methanol was added to the obtained silicone oligomer solution, to produce a treating liquid of a solid content of 1% by weight.

EXAMPLE IV-7

By using the same reactor as used in Example IV-1, 0.34 g of acetic acid and 13.8 g of distilled water were added to a solution containing 40 g of tetraethoxysilane dissolved in 93 g of methanol, and the mixture was then stirred for 8 hours at 50° C., to synthesize a silicone oligomer having a polymerization degree of siloxane units of 19. The functional end groups of the silicone oligomer, which are reactive to hydroxyl groups, are ethoxy groups and/or silanol groups.

Methanol was added to the obtained silicone oligomer solution, to produce a treating liquid of a solid content of 1% by weight.

EXAMPLE IV-8

To the silicone oligomer solution obtained in Example IV-4 were added γ-glycidoxypropyltrimethoxysilane (Trade name: A-187, produced by Nippon Unicar Co., Ltd.), as a silane coupling agent, and methanol, to produce a treating liquid of a solid content of 1% by weight (silicone oligomer:A-187=1:1 weight ratio).

EXAMPLE IV-9

To the silicone oligomer solution obtained in Example IV-4 were added N-β-(N-vinylbenzylaminoethyl)-γ-aminopropyltrimethoxysilane.hydrochloride (Trade name: SZ-6032, produced by Toray*Dow Corning*Silicone Co., Ltd.), as a silane coupling agent, and methanol, to produce a treating liquid of a solid content of 1% by weight (silicone oligomer:SZ-6032=1:1 weight ratio).

Calcined clay (mean particle size: 1.2 μm), as an inorganic filler, was dipped in each of the treating liquids produced in Examples IV-1 to 9 for one hour with stirring, filtered, and heated to 120° C. for one hour to dry, to obtain inorganic fillers treated with silicone oligomers. The adhesion amounts of the silicone oligomers were 0.08 to 0.11 % by weight.

EXAMPLE IV-10

An inorganic filler treated with a silicone oligomer was prepared in the same manner as in Example IV-1, except that talc (mean particle size: 12 μm) was used as the inorganic filler. The adhesion amount of the silicone oligomer was 0.10% by weight.

EXAMPLE IV-11

An inorganic filler treated with a silicone oligomer was prepared in the same manner as in Example IV-1, except that silica (mean particle size: 1.0 μm) was used as the inorganic filler. The adhesion amount of the silicone oligomer was 0.09% by weight.

EXAMPLE IV-12

To calcined clay was directly dropped the silicone oligomer solution which was produced in Example IV-1 and was not further diluted with methanol (silicone oligomer:calcined clay=1.0:100 weight ratio), and the mixture was stirred sufficiently, and was then dried at 120° C. for one hour, to obtain an inorganic filler treated with the silicone oligomer. The adhesion amount of the silicone oligomer was 0.05% by weight.

The surface-treated inorganic fillers produced in Examples IV-1 to 12 were mixed, respectively, with the following resin components in the following ratios, to prepare epoxy resin varnishes.

Brominated bisphenol A epoxy resin (epoxy equivalent weight:
  530): 100 parts by weight
  Dicyandiamide: 4 parts by weight
  Silicone oligomer-treated inorganic filler: 50 parts by weight
  2-ethyl-4-methylimidazole: 0.5 parts by weight These compounds were dissolved or dispersed in a methyl ethyl ketone/ethylene glycol monomethyl ether solvent mixture (1:1 weight ratio), to produce resin varnishes of a non-volatile solid content of 70% by weight.

COMPARATIVE EXAMPLE IV-1

A resin varnish was produced in the same manner as above, except that a calcined clay which had not been surface-treated was used as an inorganic filler.

COMPARATIVE EXAMPLE IV-2

A calcined clay with an adhesion amount of a silane coupling agent of 0.07% by weight was prepared by using γ-glycidoxypropyltrimethoxysilane (Trade name: A-187, produced by Nippon Unicar Co., Ltd.) in place of a silicone oligomer-containing treating liquid, and a resin varnish was produced in the same manner as above, except that the obtained, calcined clay was used.

COMPARATIVE EXAMPLE IV-3

A calcined clay with an adhesion amount of a silicone oil of 0.06% by weight was prepared by using an epoxy-modified silicone oil (Trade name: KF101, produced by Shin-Etsu Chemical Co., Ltd.) in place of a silicone oligomer-containing treating liquid, and a resin varnish was produced in the same manner as above, except that the obtained, calcined clay was used.

A glass fabric of about 0.2 mm thickness was impregnated with each of the resin varnishes produced in Examples IV-1 to 12 and Comparative Examples IV-1 to 3 to obtain impregnated glass fabrics, which were then heated to 140° C. for 5 to 10 minutes to dry, to obtain prepregs of a resin content of 41% by weight. Four sheets of each prepreg were superposed on each other, with copper foil of 35 μm thickness superposed on each side of the superposed prepreg, and then bonding was performed under the pressing conditions of 170° C., 90 minutes and 4.0 MPa, to produce double-sided copper-clad laminates.

The obtained double-sided copper-clad laminates were examined for drilling processability, water absorption, soldering heat resistance and electrolytic corrosion resistance. The results are listed in Tables IV-1 and IV-2.

TABLE IV-1

| | Examples | | | | | | |
|---|---|---|---|---|---|---|---|
| | IV-1 | IV-2 | IV-3 | IV-4 | IV-5 | IV-6 | IV-7 |
| Dimethoxy-dimethylsilane (g) | — | — | 34 | 20 | — | 10 | — |
| Trimethoxy-methylsilane (g) | — | 40 | — | — | 20 | 10 | — |
| Tetramethoxysilane (g) | 40 | — | 8 | 25 | 22 | 20 | — |
| Tetraethoxysilane (g) | — | — | — | — | — | — | 40 |
| Methanol (g) | 93 | 93 | 98 | 105 | 98 | 93 | 93 |
| Acetic acid (g) | 0.47 | 0.53 | 0.60 | 0.60 | 0.52 | 0.52 | 0.34 |
| Distilled water (g) | 18.9 | 15.8 | 14.0 | 17.8 | 18.3 | 16.5 | 13.8 |
| Conditions of synthesis | 50° C., 8 hours | | | | | | |

TABLE IV-1-continued

| | Examples | | | | | | |
|---|---|---|---|---|---|---|---|
| | IV-1 | IV-2 | IV-3 | IV-4 | IV-5 | IV-6 | IV-7 |
| Siloxane repeating units | 20 | 15 | 28 | 30 | 25 | 23 | 19 |
| Calcined clay | Used | Used | Used | Used | Used | Used | Used |
| Drilling processability (crack %) | 19 | 23 | 22 | 18 | 19 | 17 | 20 |
| Water absorption (wt %) | 0.75 | 0.72 | 0.71 | 0.74 | 0.74 | 0.72 | 0.70 |
| Soldering heat resistance | OK | OK | OK | OK | OK | OK | OK |
| Electrolytic corrosion resistance (hr) | >500 | >500 | >500 | >500 | >500 | >500 | >500 |

TABLE IV-2

| | Examples | | | | | Comparative Examples | | |
|---|---|---|---|---|---|---|---|---|
| | IV-8 | IV-9 | IV-10 | IV-11 | IV-12 | IV-1 | IV-2 | IV-3 |
| Silicone oligomer Example No.: | Used IV-4 | Used IV-4 | Used IV-1 | Used IV-1 | Used IV-1 | — | — | — |
| A-187 | Used | — | — | — | — | — | Used | — |
| SZ-6032 | — | Used | — | — | — | — | — | — |
| KF101 | — | — | — | — | — | — | — | Used |
| Calcined clay | Used | Used | — | — | Used | Used | Used | Used |
| Talc | — | — | Used | — | — | — | — | — |
| Silica | — | — | — | Used | — | — | — | — |
| Drilling processability (crack %) | 24 | 24 | 18 | 19 | 24 | 38 | 36 | 44 |
| Water absorption (wt %) | 0.68 | 0.67 | 0.74 | 0.73 | 0.77 | 0.88 | 0.80 | 0.92 |
| Soldering heat resistance | OK | OK | OK | OK | OK | OK | OK | OK |
| Electrolytic corrosion resistance (hr) | >500 | >500 | >500 | >500 | >500 | 288 | 360 | 240 |

A-187: γ-glycidoxypropyltrimethoxysilane
SZ-6032: N-β-(N-vinylbenzylaminoethyl)-γ-aminopropyltrimethoxysilane.hydrochloride
KF101: epoxy-modified silicone oil The tests were carried out in the same manner as in Examples II-1 to 9, Referential Examples II-1 to 5 and Comparative Examples II-1 to 4. Except in the tests for electrolytic corrosion resistance, test pieces from which copper foil was completely etched off were used.

The results show that the laminates of Examples IV-1 to 12 did not decreased in soldering heat resistance, absorbed little water, were hardly cracked by drilling and were improved in electrolytic corrosion resistance.

The resin compositions (B) of the present invention can improve the laminates produced by using them in drilling processability and in insulation properties including electrolytic corrosion resistance, without deteriorating the properties of the conventional laminates.

INDUSTRIAL APPLICABILITY

The prepregs provided by the present invention are excellent in the adhesion on the interface between base materials and resins. The resin varnishes provided by the present invention are excellent in the dispersibility of inorganic fillers and in the adhesion on the interface between inorganic fillers and resins. The resin compositions provided by the present invention are also excellent in the dispersibility of inorganic fillers and in the adhesion on the interfaces between inorganic fillers and resins and between base materials and resins. The prepregs, resin varnishes and resin compositions which are provided by the present invention are useful for the production of laminates for printed wiring boards and multilayer printed wiring boards, and the product printed wiring boards and multilayer printed wiring boards are excellent not only in heat resistance and moisture resistance, but also in drilling processability and insulation properties, including electrolytic corrosion resistance, and are therefore suitable as parts of various electric and electronic apparatuses.

What is claimed is:

1. A resin composition, comprising a resin material and a silicone oligomer which is three-dimensionally crosslinked, has a polymerization degree of 2 to 70, has at least one functional end group reactive to a hydroxyl group, and contains at least one kind of siloxane units selected from trifunctional siloxane units ($RSiO_{3/2}$) and tetrafunctional siloxane units ($SiO_{4/2}$), wherein each R is an organic group and the organic groups R in the crosslinked silicone oligomer are identical with or different from one another, the silicone oligomer having been synthesized by polycondensing at least one chlorosilane or alkoxysilane corresponding to the siloxane units, in the presence of water and an acid catalyst.

2. The resin composition of claim 1, wherein the polymerization degree of the silicone oligomer is 10 to 50.

3. The resin composition according to claim 1, the silicone oligomer being maintained with said polymerization degree of 2 to 70 in the resin composition.

4. The resin composition of claim 1, wherein the resin material comprises a resin and a curing agent therefor, the resin being selected from the group consisting of epoxy resin, polyimide resin, triazine resin, phenolic resin, melamine resin, polyester resin and modified resins of these resins.

5. The resin composition of claim 1, wherein the silicone oligomer comprises difunctional siloxane units ($R_2SiO_{2/2}$) and trifunctional siloxane units ($RSiO_{3/2}$) and has a polymerization degree of 6 to 70.

6. The resin composition of claim 1, wherein the silicone oligomer comprises tetrafunctional siloxane units ($SiO_{4/2}$) and has a polymerization degree of 6 to 70.

7. The resin composition of claim 1, wherein the silicone oligomer comprises trifunctional siloxane units ($RSiO_{3/2}$) and has a polymerization degree of 6 to 70.

8. The resin composition of claim 1 further containing a coupling agent.

9. The resin composition of claim 1 further containing an inorganic filler.

10. The resin composition of claim 1 Further containing a coupling agent and an inorganic filler.

11. The resin composition of claim 1, wherein the silicone oligomer comprises difunctional siloxane units ($R_2SiO_{2/2}$) and tetrafunctional siloxane units ($SiO_{4/2}$) and has a polymerization degree of 6 to 70.

12. The resin composition of claim 11, wherein the tetrafunctional siloxane units ($SiO_{4/2}$) are at least 15 molt % of total siloxane units of the silicone oligomer.

13. The resin composition of claim 1, wherein the silicone oligomer comprises trifunctional siloxane units ($RSiO_{3/2}$) and tetrafunctional siloxane units ($SiO_{4/2}$) and has a polymerization degree of 6 to 70.

14. The resin composition of claim 13, wherein the tetrafunctional siloxane units ($SiO_{4/2}$) are at least 15 mol % of total siloxane units of the silicone oligomer.

15. The resin composition of claim 1, wherein the silicone oligomer comprises difunctional siloxane units ($R_2SiO_{2/2}$), trifunctional siloxane units ($RSiO_{3/2}$) and tetrafunctional siloxane units ($SiO_{4/2}$) and has a polymerization degree of 6 to 70.

16. The resin composition of claim 15, wherein the tetrafunctional siloxane units ($SiO_{4/2}$) are at least 15 mol % of total siloxane units of the silicone oligomer.

17. A laminate for a printed wiring board, which is produced by steps consisting essentially of impregnating a base material with the resin composition of claim 1, drying the impregnated base material at 80° to 200° C. to form a prepreg, superposing two or more sheets of the prepreg on each other, with a metal foil superposed on one or both sides of the superposed sheets of the prepreg, to form a superposed composite, and then bonding the superposed composite with heat and pressure at 150° to 200° C.

18. The laminate according to claim 18, wherein said silicone oligomer, having the degree of polymerization of 2 to 70, is substantially not further crosslinked in producing the laminate.

19. A resin varnish comprising a solvent, a resin material and an inorganic filler treated at room temperature to 80° C. with a treating liquid for surface treatment, the treating liquid containing a silicone oligomer dissolved in a solvent, the silicone oligomer containing at least one kind of siloxane unit selected from trifunctional siloxane units ($RSiO_{3/2}$) and tetrafunctional siloxane units ($SiO_{4/2}$), wherein each R is an organic group and the organic groups R in the silicone oligomer are identical with or different from one another, being three-dimensionally crosslinked, having a polymerization degree of 2 to 70, and having at least one functional end group reactive to a hydroxyl group, the silicone oligomer having been synthesized by polycondensing at least one chlorosilane or alkoxysilane corresponding to the siloxane units, in the presence of water and an acid catalyst.

20. The resin varnish of claim 19, wherein the polymerization degree of the silicone oligomer is 10 to 50.

21. The resin varnish of claim 19, wherein the inorganic filler has a surface coated with the silicone oligomer by steps consisting essentially of treating the inorganic filler, with the treating liquid, at room temperature to 80° C., the treating liquid, for the surface treatment, containing the silicone oligomer dissolved in the solvent.

22. The resin varnish according to claim 19, the silicone oligomer being maintained with said polymerization degree of 2 to 70 in the resin varnish.

23. A resin composition, comprising a resin material and an inorganic filler treated with a silicone oligomer (a) which contains at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, (b) is three-dimensionally crosslinked and has a polymerization degree of 2 to 70, and (c) has at least one functional end group reactive to a hydroxyl group, the treated inorganic filler having been prepared by adhering the silicone oligomer to the inorganic filler, and then drying adhered silicone oligomer on the inorganic filler at 50° to 200° C., the silicone oligomer having been synthesized by polycondensing at least one chlorosilane or alkoxysilane corresponding to the siloxane units, in the presence of water and an acid catalyst.

24. The resin composition of claim 23, wherein the inorganic filler treated with the three-dimensionally crosslinked silicone oligomer is prepared by steps consisting essentially of adhering the silicone oligomer to the inorganic filler, and then drying at 50° to 150° C.

25. The resin composition according to claim 23, the silicone oligomer being maintained with said polymerization degree of 2 to 70 in the resin composition.

26. The resin composition of claim 23, wherein the polymerization degree of the silicone oligomer is 10 to 50.

27. The resin composition of claim 23, wherein the silicone oligomer coats the inorganic filler.

28. The resin composition for of claim 23, wherein the silicone oligomer comprises difunctional siloxane units ($R_2SiO_{2/2}$) and trifunctional siloxane units ($RSiO_{3/2}$) and has a polymerization degree of 6 to 70.

29. The resin composition of claim 23, wherein the silicone oligomer comprises tetrafunctional siloxane units ($SiO_{4/2}$) and has a polymerization degree of 6 to 70.

30. The resin composition of claim 23, wherein the silicone oligomer comprises trifunctional siloxane units ($RSiO_{3/2}$) and has a polymerization degree of 6 to 70.

31. The resin composition of claim 23, wherein the inorganic filler is treated with the silicone oligomer and a coupling agent.

32. The resin composition of claim 23, wherein the resin material comprises a resin and a curing agent therefor, the resin being selected from the group consisting of epoxy resin, polyimide resin, triazine resin, phenolic resin, melamine resin, polyester resin and modified resins of these resins.

33. The resin composition of claim 32, wherein the inorganic filler includes at least one of calcium carbonate, alumina, titanium oxide, mica, aluminum carbonate, aluminum hydroxide, magnesium silicate, aluminum silicate, clay, talc, silica, glass, aluminum borate and silicon carbide.

34. The resin composition of claim 23, wherein the silicone oligomer comprises trifunctional siloxane units ($RSiO_{3/2}$) and tetrafunctional siloxane units ($SiO_{4/2}$) and has a polymerization degree of 6 to 70.

35. The resin composition of claim 34, wherein the tetrafunctional siloxane units ($SiO_{4/2}$) are at least 15 mol % of total siloxane units of the silicone oligomer.

36. The resin composition of claim 23, wherein the silicone oligomer comprises difunctional siloxane units ($R_2SiO_{2/2}$) and tetrafunctional siloxane units ($SiO_{4/2}$) and has a polymerization degree of 6 to 70.

37. The resin composition of claim 36, wherein the tetrafunctional siloxane units ($SiO_{4/2}$) are at least 15 mol % of total siloxane units of the silicone oligomer.

38. The resin composition of claim 23, wherein the silicone oligomer comprises difunctional siloxane units ($R_2SiO_{2/2}$), trifunctional siloxane units ($RSiO_{3/2}$) and tetrafunctional siloxane units ($SiO_{4/2}$) and has a polymerization degree of 6 to 70.

39. The resin composition of claim 38, wherein the tetrafunctional siloxane units ($SiO_{4/2}$) are at least 15 mol % of total siloxane units of the silicone oligomer.

40. A laminate for a printed wiring board, which is produced by steps consisting essentially of impregnating a base material with the resin composition of claim 23, drying the impregnated base material at 80° to 200° C. to form a prepreg, superposing two or more sheets of the prepreg on each other, with a metal foil superposed on one or both sides of the superposed sheets of the prepreg, to form a superposed composite, and then bonding the superposed composite with heat and pressure at 150° to 200° C.

41. The laminate according to claim 40, wherein said silicone oligomer, having the degree of polymerization of 2 to 70, is substantially not further crosslinked in producing the laminate.

42. A method of producing a resin varnish, consisting essentially of dipping an inorganic filler in a treating liquid for surface treatment, and then compounding a resin material directly with the treating liquid containing the treated inorganic filler, by directly combining the resin material with the treating liquid containing the treated inorganic filler, the treating liquid containing a silicone oligomer dissolved in a solvent, the silicone oligomer (1) containing at least one kind of siloxane units selected from trifunctional siloxane units ($RSiO_{3/2}$) and tetrafunctional siloxane units ($SiO_{4/2}$), wherein each R is an organic group and the organic groups R in the silicone oligomer are identical with or different from one another, (2) being three-dimensionally crosslinked, (3) having a polymerization degree of 2 to 70, and (4) having at least one functional end group reactive to a hydroxyl group, the silicone oligomer having been synthesized by polycondensing at least one chlorosilane or alkoxysilane corresponding to the siloxane units, in the presence of water and an acid catalyst.

43. The method of claim 42, wherein the resin material is directly compounded with the treating liquid containing the treated inorganic filler without drying the treating liquid containing the treated inorganic filler.

44. The method of claim 42, wherein the silicone oligomer, having a polymerization degree of 2 to 70, has substantially no further crosslinking in producing the resin varnish.

45. The method of claim 42, wherein the resin material comprises a resin and a curing agent therefor, the resin being selected from the group consisting of epoxy resin, polyimide resin, triazine resin, phenolic resin, melamine resin, polyester resin and modified resins of these resins.

46. The method of claim 42, wherein the silicone oligomer comprises difunctional siloxane units ($R_2SiO_{2/2}$) and trifunctional siloxane units ($RSiO_{3/2}$) and has a polymerization degree of 6 to 70.

47. The method of claim 42, wherein the silicone oligomer comprises tetrafunctional siloxane units ($SiO_{4/2}$) and has a polymerization degree of 6 to 70.

48. The method of claim 42, wherein the silicone oligomer comprises trifunctional siloxane units ($RSiO_{3/2}$) and has a polymerization degree of 6 to 70.

49. The method of claim 42, wherein the treating liquid further contains a silane coupling agent dissolved in the solvent.

50. The method of claim 42, wherein the treating liquid further contains a titanate coupling agent dissolved in the solvent.

51. The method of claim 42, wherein the silicone oligomer comprises difunctional siloxane units ($R_2SiO_{2/2}$) and tetrafunctional siloxane units ($SiO_{4/2}$) and has a polymerization degree of 6 to 70.

52. The method of claim 51, wherein the tetrafunctional siloxane units ($SiO_{4/2}$) are at least 15 mol % of total siloxane units of the silicone oligomer.

53. The method of claim 42, wherein the silicone oligomer comprises trifunctional siloxane units $RSiO_{3/2}$) and tetrafunctional siloxane units ($SiO_{4/2}$) and has a polymerization degree of 6 to 70.

54. The method of claim 53, wherein the tetrafunctional siloxane units ($SiO_{4/2}$) are at least 15 mol % of total siloxane units of the silicone oligomer.

55. The method of claim 42, wherein the silicone oligomer comprises difunctional siloxane units ($R_2SiO_{2/2}$), trifunctional siloxane units ($RSiO_{3/2}$) and tetrafunctional siloxane units ($SiO_{4/2}$) and has a polymerization degree of 6 to 70.

56. The method of claim 55, wherein the tetrafunctional siloxane units ($SiO_{4/2}$) are at least 15 mol % of total siloxane units of the silicone oligomer.

57. The method of claim 42, wherein the polymerization degree of the silicone oligomer is 10 to 50.

58. A laminate for a printed wiring board, which is produced by steps consisting essentially of impregnating a base material with the resin varnish which is produced by the method of claim 42, drying the impregnated base material at 80° to 200° C. to form a prepreg, superposing two or more sheets of the prepreg on each other, with a metal foil superposed on one or both sides of the superposed sheets of the prepreg, to form a superposed composite, and then bonding the superposed composite with heat and pressure at 150° to 200° C.

59. The laminate according to claim 58, wherein said silicone oligomer, having the polymerization degree of 2 to 70, is substantially not further crosslinked in said laminate.

* * * * *